United States Patent
Clark et al.

(10) Patent No.: US 7,097,708 B2
(45) Date of Patent: Aug. 29, 2006

(54) SUBSTITUTED DONOR ATOMS IN SILICON CRYSTAL FOR QUANTUM COMPUTER

(75) Inventors: Robert Graham Clark, Balgowlah Heights (AU); Neil Jonathan Curson, Coogee (AU); Toby Hallam, Enmore (AU); Lars Oberbeck, Coogee (AU); Steven Richard Schofield, Randwick (AU); Michelle Yvonne Simmons, Coogee (AU)

(73) Assignee: Qucor Pty Ltd., Sydney (AU)

( * ) Notice: Subject to any disclaimer, the term of this patent is extended or adjusted under 35 U.S.C. 154(b) by 0 days.

(21) Appl. No.: 10/484,759

(22) PCT Filed: Aug. 20, 2002

(86) PCT No.: PCT/AU02/01116

§ 371 (c)(1),
(2), (4) Date: Jul. 13, 2004

(87) PCT Pub. No.: WO03/018465

PCT Pub. Date: Mar. 6, 2003

(65) Prior Publication Data

US 2004/0244672 A1    Dec. 9, 2004

(30) Foreign Application Priority Data

Aug. 27, 2001 (AU) ................................. PR7290
Mar. 18, 2002 (AU) ................................. PS1095
Mar. 20, 2002 (AU) ................................. PS1271
Jul. 8, 2002   (AU) ............................ 2002950046

(51) Int. Cl.
    *C30B 25/12*    (2006.01)

(52) U.S. Cl. ............................ 117/94; 117/84; 117/95; 117/96; 117/104

(58) Field of Classification Search ................. 117/94, 117/95, 96, 84, 104
    See application file for complete search history.

(56) References Cited

U.S. PATENT DOCUMENTS 6,472,681 B1 * 10/2002 Kane ........................... 257/14

FOREIGN PATENT DOCUMENTS

JP         2001-053014 A    5/2002

OTHER PUBLICATIONS

O'Brien et al , Towards the fabriaction of phosphorus qubits for a silicon quantum computer, arXiv:cond-mat/0104569 vol. 1 Apr. 30, 2001 pp. 1-5.*
Shen, T.-C. et al.. Al Nucleation on monohydride and bare SI(001) surfaces: atomic scale patterning. Physical Review Letters. vol. 78. No. 7. p. 1271-74, Issued Feb. 17, 1997.

* cited by examiner

*Primary Examiner*—Robert Kunemund
(74) *Attorney, Agent, or Firm*—Wood, Phillips, Katz, Clark & Mortimer

(57) ABSTRACT

This invention concerns nanoscale products, such as electronic devices fabricated to nanometer accuracy. It also concerns atomic scale products. These products may have an array of electrically active dopant atoms in a silicon surface, or an encapsulated layer of electrically active donor atoms. In a further aspect the invention concerns a method of fabricating such products. The methods include forming a preselected array of donor atoms incorporated into silicon. Encapsulation by growing silicon over a doped surface, after desorbing the passivating hydrogen. Also, using an STM to view donor atoms on the silicon surface during fabrication of a nanoscale device, and measuring the electrical activity of the donor atoms during fabrication of a nanoscale device. Such products and processes are useful in the fabrication of a quantum computer, but could have many other uses.

58 Claims, 40 Drawing Sheets

PH₃ OR PH₂

BEFORE PHOSPHINE DOSING

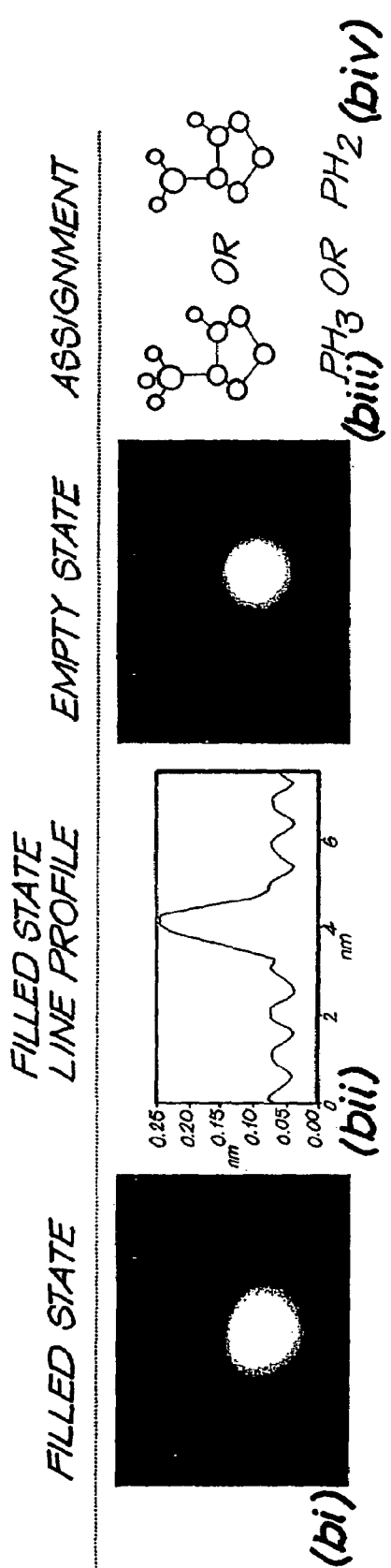
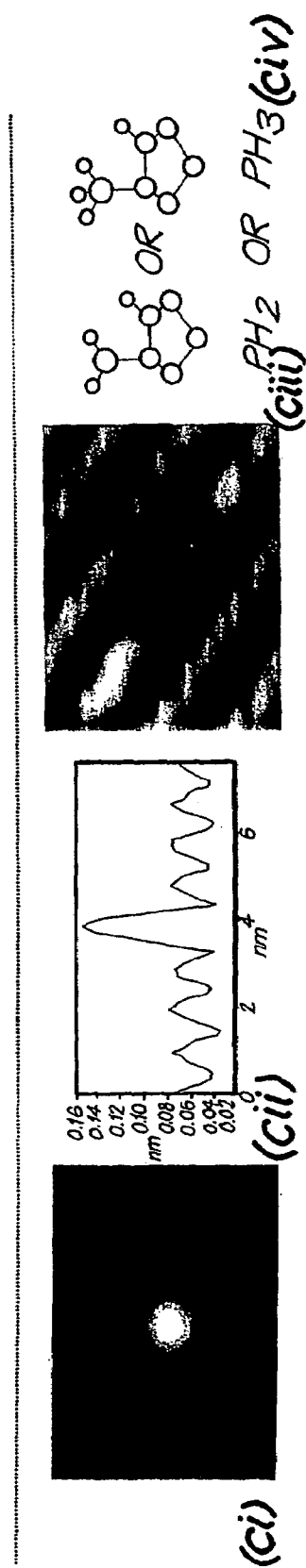
FIG. 9b
FIG. 9c

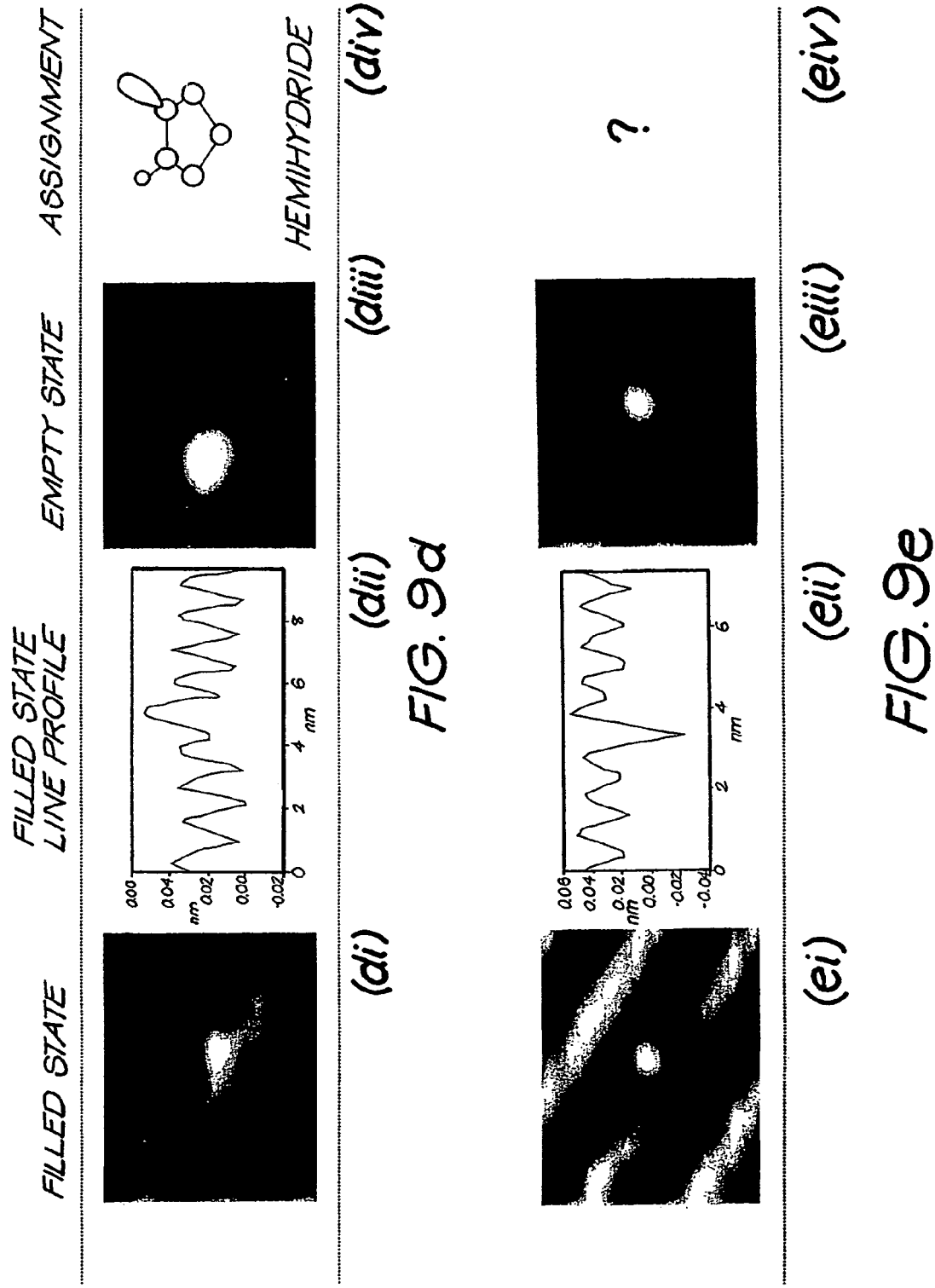

BIAS = -3.0V
I_t = 0.1nA

BIAS= -1.6V
$I_t = 0.2 nA$

FIG. 15i — STEP-FLOW GROWTH
HIGH MOBILITY OF Si ATOMS, NO NUCLEATION

FIG. 15j
SEVERAL LAYERS GROW SIMULTANEOUSLY

FIG. 15k — RANDOM GROWTH
SUPPRESSED SURFACE DIFFUSION → ROUGHENING (i) (ii)

(i) (ii)

(i) (ii)

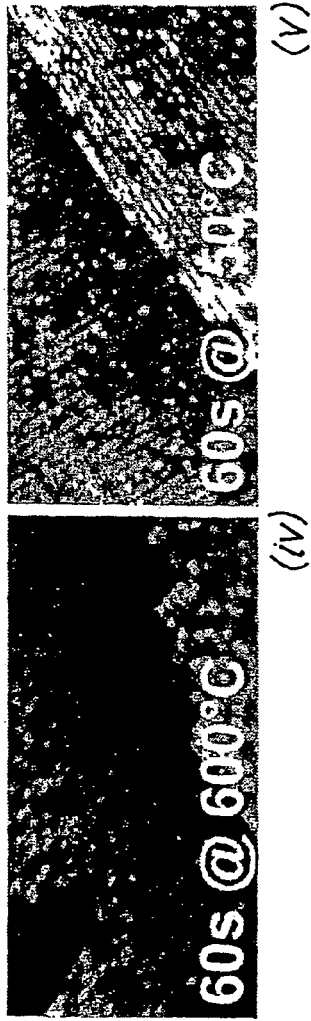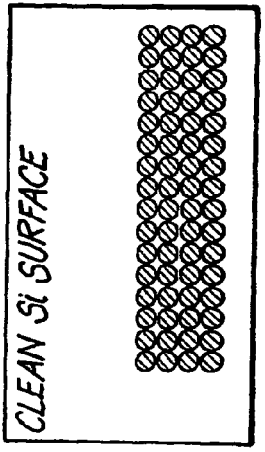
FIG. 19d
FIG. 19e (i)     (ii)

(i)     (ii)

(i)     (ii)

SUBSTITUTED DONOR ATOMS IN SILICON CRYSTAL FOR QUANTUM COMPUTER

TECHNICAL FIELD

This invention concerns nanoscale products, such as electronic devices fabricated to nanometer accuracy. It also concerns atomic scale products and where we use the term nanoscale we intend nanoscale and atomic scale products. Such products could be intermediate products in the fabrication of a quantum computer, but could have many other uses. In further aspects the invention concerns methods of fabricating such products. It also concerns a quantum computer.

BACKGROUND ART

The Kane proposal[1,2] for a silicon-based quantum computer uses the nuclear spin of phosphorus nuclei ($I=\frac{1}{2}$) as the qubits embedded in isotopically pure $^{28}Si$ ($I=0$). At low temperatures the donor electron remains bound to the P nucleus and surface "A" gates control the hyperfine interaction between nuclear and electron spins, enabling polarization of the two. The two P donors need to be ~20 nm apart to allow the adjacent donor electron wavefunctions to overlap. Coupling between adjacent donor electrons is achieved using separate surface "J" gates, enabling an electron mediated interaction between qubits. FIG. 1(a) shows this proposed structure.

A number of patent applications and papers are relevant to the building of such a device, and these are cited below:

[1]Kane, B. E. A silicon-based nuclear spin quantum computer. *Nature* 393, 133 (1998).

[2]Kane, B. E. Patent Application PCT/AU98/00778.

[3]Vrijen, R., Yablonovitch, L., Kang Wang, Hong Wen Jiang, Balandin, A, Roychowdhury, V., Mor, T., DiVincenzo, D. Electron-spin-resonance transistors for quantum computing in silicon-germanium heterostructures. *Phys. Rev. A* 62, 012306/1–10 (2000).

[4]Swartzentruber, B. S., Mo, Y. W., Webb, M. B. & Lagally, M. G. Scanning tunneling microscopy studies of structural disorder and steps on Si surfaces. *J. Vac. Sci. Tech. A* 7, 2901 (1989).

[5]Hata, K., Kimura, T., Ozawa, S. and Miyamoto, N. How to fabricate a defect free surface. *J. Vac. Sci. Technol. A* 18, 1933 (2000).

[6]Hata, K., Yasuda, S. and Shigekawa, H. Reinterpretation of the scanning tunneling microscopy images of the Si(100) 2×1 dimers. *Phys. Rev. B.* 60, 8164 (1999).

[7]Oura, K., Lifshits, V. G., Saranin, A. A., Zotov, A. V. & Katayama, M. Hydrogen interaction with clean and modified silicon surfaces; *Surf. Sci. Rep.* 35, 1 (1999).

[8]Hamers, R. J., Avouris, Ph. & Bozso, F. Imaging of chemical-bond formation with the scanning tunneling microscope. $NH_3$ dissociation on Si(001) *Phys. Rev. Left.* 59, 2071 (1987).

[9]Thirstrup, C., private communication

[10]Wang, Y., Bronikowski, M. J. & Hamers, R. J. An atomically-resolved STM study of the interaction of phosphine ($PH_3$) with the silicon (001) surface. *J. Phys. Chem.* 98, 5966 (1994).

[11]Hill, E., Freelon, B., Ganz, E. Diffusion of hydrogen on the Si(001) surface investigated by STM atom tracking. *Phys. Rev. B* 60, 15896 (1999).

[12]Lin, D. S., Ku, T. S., and Chen, R. P. Interaction of phosphine with Si(100) from core-level photoemission and real-time scanning tunneling microscopy *Phys. Rev. B* 61, 2799 (2000).

[12]Lin, D. S., Ku, T. S., and Chen, R. P. Interaction of phosphine with Si(100) from core-level photoemission and real-time scanning tunneling microscopy *Phys. Rev. B* 61, 2799 (2000).

[14]Wang, Y., Chen, X. and Hamers, R. J., Atomic-resolution study of overlayer formation and interfacial mixing in the interaction of phosphorus with Si(001) *Phys. Rev. B* 50, 4534 (1994).

[15]Zhi-Heng Loh, Kang, H. C. Chemisorption of $NH_3$ on Si(100)2×1: A study by first-principles ab initio and density functional theory. *J. Chem. Phys.* 112, 2444–2451 (2000).

[16]Northrup, J. E. Theoretical studies of arsine adsorption on Si(100). *Phys. Rev. B* 51, 2218–2222 (1995).

To date there have been no STM studies of the incorporation of single phosphorus atoms from a dopant source such as phosphine into silicon.

This invention demonstrates, for the first time, achievement of a number of the intermediate products and steps necessary to produce a silicon based atomic-scale device such as a quantum computer in line with the Kane proposal.

SUMMARY OF THE INVENTION

In a first aspect the invention is a nanoscale product, being an intermediate product of a process for fabricating an atomic scale device such as a quantum computer, the nanoscale product comprising:

A silicon crystal, where donor atoms are substituted for silicon atoms in the surface to form an array of donor atoms spaced apart from each other by 100 nm or less, and where the donor atoms are electrically active.

The following Best Modes of the Invention demonstrate the production of such an array in a silicon surface for the first time.

The silicon surface may be the (100)-oriented surface having a 2×1 unit cell surface structure with rows of σ-bonded silicon dimers. In this case the donor atoms replace silicon atoms in the surface to form donor-silicon hetero-dimers.

The donor may be phosphorus and the phosphorus atoms may be placed with greater precision, such as 50 nm or 20 nm apart.

In a second aspect the invention is a nanoscale product, being an intermediate product of a process for fabricating an atomic scale device such as a quantum computer, the nanoscale product comprising:

A silicon crystal encapsulating a layer of donor atoms substituted for silicon atoms in the crystal, where substantially all the donor atoms are electrically active.

The following Best Modes of the Invention demonstrate the production of an encapsulated layer of completely electrically active phosphorus atoms with a concentration of 0.1 monolayer and more for the first time.

The encapsulating layers may be epitaxially grown over the layer of donor atoms. The encapsulating layers may be between 5 and 50 nm thick.

The silicon surface may be (100)-oriented, where the donor atoms replace silicon atoms to form donor-silicon heterodimers.

The donors may be Phosphorus and they may be placed in an array.

According to a third aspect, the invention is a method of fabricating a nanoscale or atomic scale product as defined above, comprising the following steps:

(a) Preparing a clean silicon crystal surface.

(b) Passivating the sample surface with atomic hydrogen.

(c) Selectively desorbing single H atoms from the passivated surface using a Scanning Tunnelling Microscope (STM) tip to form a pattern of exposed areas in the hydrogen layer, where the areas are spaced from each other by 100 nm or less.

(d) Exposing the patterned surface to donor molecules to produce an array of single donor atom bearing molecules in the exposed areas.

(e) Annealing the arrayed surface at between about 300° C. and about 650° C. to incorporate electrically active donor atoms into the silicon.

The following Best Modes of the Invention demonstrate the performance of this method to form a preselected array of donor atoms incorporated into silicon for the first time. This is achieved by use of the annealing step (e), and in this step the temperature range may be selected between about 300° C., or 350° C., and 530° C. to avoid desorbing hydrogen from the silicon surface. The hydrogen may then be desorbed using an electron beam, as found in an STM or scanning electron microscope (SEM) or using ultra-violet (UV) light.

The process may include a further step of: (f) Using an STM to view donor atoms on the silicon surface to confirm that the donor atoms are in a substitutional lattice site in the silicon, and are therefore electrically active.

The silicon surface may be (100)-oriented having a 2×1 unit cell surface structure with rows of σ-bonded silicon dimers. In this case the donor atoms replace silicon atoms in the surface to form donor-silicon heterodimers.

The donor may be phosphorus and the phosphorus atoms may be placed with greater precision, such as 50 nm or 20 nm apart.

According to a fourth aspect, the invention is a method of fabricating a nanoscale or atomic scale product as defined above, comprising the following steps:

(a) Preparing a clean silicon crystal surface.

(b) Passivating the sample surface with atomic hydrogen.

(c) Inserting donor atoms into the silicon at lithographically defined areas where the hydrogen was desorbed using an STM tip;

(d) Desorbing the passivating hydrogen atoms from a doped surface by either flashing the surface to between about 500° C. and about 650° C. or using an electron beam, as found in an STM or scanning electron microscope (SEM) or using ultra-violet (UV) light.

(e) Growing silicon over the surface, at between about 0° C. and 400° C. to prevent diffusion of the donor atoms and to encapsulate electrically active donor atoms in the surface.

In the following Best Modes of the Invention we demonstrate the selection of this method of encapsulation by growing silicon over the surface, after desorbing the passivating hydrogen. The growth of silicon in step (e) may take place at low temperatures such as between about 0° C. and 250° C., e.g. at room temperature.

The method may include the further step of: (f) Thermally annealing the surface so that it becomes atomically smooth.

The silicon surface may be (100)-oriented having a 2×1 unit cell surface structure with rows of σ-bonded silicon dimers. In this case the donor atoms replace silicon atoms in the surface to form donor-silicon heterodimers.

The donor may be phosphorus and the phosphorus atoms may be place with selected precision, such as 100 nm, 50 nm or 20 nm apart.

According to a fifth aspect, the invention is a method of fabricating a nanoscale or atomic scale product as defined above, comprising the following steps:

(a) Preparing a clean silicon crystal surface.

(b) Exposing the surface to donor molecules such that the donor molecules adsorb over the silicon surface.

(c) Annealing the arrayed surface at between about 300° C. and about 650° C. to incorporate electrically active donor atoms into the silicon.

(d) Using an STM to view donor atoms on the surface to confirm that the donor atoms are in a substitutional lattice site in the silicon, and are therefore electrically active.

The following Best Modes of the Invention demonstrate the use of this method to use an STM to view donor atoms in or under the silicon surface during fabrication of a nanoscale device for the first time.

The annealing step may use a temperature range between 300° C., or 350° C., and 530° C. to avoid desorbing hydrogen from the silicon surface. The hydrogen may then be desorbed using an electron beam, as found in an STM or scanning electron microscope (SEM) or using ultra-violet (UV) light. Alternatively, the annealing step may use a temperature range between 530° C. and 650° C. to both incorporate the donor atoms and desorb the hydrogen in a single step.

The method may include the further step of: (e) Growing silicon over the surface, at between about 0° C. and 400° C., between about 0° C. and 250° C. or at room temperatures to prevent diffusion of the donor atoms, to encapsulate electrically active donor atoms in the surface.

The method may include the further step of: (f) Thermally annealing the surface so that it becomes atomically smooth.

The silicon surface may be (100)-oriented having a 2×1 unit cell surface structure with rows of σ-bonded silicon dimers. In this case the donor atoms replace silicon atoms in the surface to form donor-silicon heterodimers.

The donor may be phosphorus and the phosphorus atoms may be placed with selected precision, such as 100 nm, 50 nm or 20 nm apart.

According to a sixth aspect, the invention is a method of fabricating a nanoscale or atomic scale product as defined above, comprising the following steps:

(a) Preparing a clean silicon crystal surface.

(b) Exposing the surface to donor molecules such that the donor molecules adsorb over the silicon surface to form a doped layer.

(c) Annealing the surface at between about 300° C. and about 650° C. to incorporate the donor atoms into the silicon surface.

(d) Growing silicon over the surface, at between about 0° C. and 400° C. to prevent diffusion of the donor atoms, and to encapsulate electrically active donor atoms in the surface.

(e) Measuring the electrical activity of the doped layer.

The following Best Modes of the Invention demonstrate the use of this method, in which the complete electrical activation of the phosphorus atoms having a concentration of more than 0.1 monolayer is measured during fabrication of a nanoscale device for the first time.

The annealing step may use a temperature range between 300° C., or 350° C., and 530° C. to avoid desorbing hydrogen from the silicon surface. The hydrogen may then be desorbed using an electron beam, as found in an STM or scanning electron microscope (SEM) or using ultra-violet (UV) light. Alternatively, the annealing step may use a temperature range between 530° C. and 650° C. to both incorporate the donor atoms and desorb the hydrogen in a single step.

The silicon growth may take place at between about 0° C. and 250° C. or at room temperature to prevent diffusion of the donor atoms, to encapsulate electrically active donor atoms in the surface.

The silicon surface may be (100)-oriented having a 2×1 unit cell surface structure with rows of σ-bonded silicon dimers. In this case the donor atoms replace silicon atoms in the surface to form donor-silicon heterodimers.

The donor may be phosphorus and the phosphorus atoms may be placed with selected precision, such as 100 nm, 50 nm or 20 nm apart.

The clean silicon surface may be produced in an ultra-high-vacuum environment by:
 (i) outgassing for 6 hours at ~600° C. by indirect heating.
 (ii) flashing the samples to ~1200° C. for ~1 minute by passing a DC current directly through the sample.
 (iii) reducing the sample temperature to ~950° C. and then cooling slowly from ~950° C. to room temperature.

The surface may be passivated with atomic hydrogen in the same ultra-high-vacuum environment, the dose rate being controlled by monitoring the total pressure of the vacuum system to achieve hydrogen termination of the surface, being a mono layer of hydrogen with one hydrogen atom bonded to each silicon atom (mono-hydride dimer).

The H atoms may be selectively desorbed from the passivated surface using an STM tip in the same ultra-high-vacuum environment, by applying pulses of both high voltage and tunneling current to the tip for a short time period of the order 1 ms, to form a pattern in the hydrogen layer.

The surface may be exposed to donor molecules in the same ultra-high-vacuum environment, such that the donor molecules bond to the exposed pattern in the surface.

The donor molecules may be phosphine ($PH_3$) to deliver donor atoms of phosphorus, P.

Specifically these processes may form part of a process for producing an atomic array of phosphorus atoms in silicon with the controlled separation for a silicon based quantum computer. Such a solid-state quantum computer may use either the electron spin[3] or nuclear spin of phosphorus nuclei (I=½) as the qubits embedded in isotopically pure $^{28}Si$(I=0).

In a seventh aspect the invention is a quantum computer fabricated according to any of the methods defined above.

BRIEF DESCRIPTION OF THE DRAWINGS

Aspects and examples of the invention will now be described with reference to the following accompanying drawings, in which:

FIGS. 2(a) to (k) is a series of eleven steps according to the invention for the fabrication of a nanoscale product.

FIGS. 9(a) to (e) are STM images of a silicon (100) surface after phosphine dosing.

FIGS. 15(i), (j) and (k) are a series of schematic diagrams explaining the different temperature dependent growth modes.

FIG. 19a to FIG. 19e are a series of diagrams and STM images showing room temperature encapsulation of a phosphine dosed silicon surface and subsequent annealing.

BEST MODES OF THE INVENTION

Fabrication Approach

Figure 1:
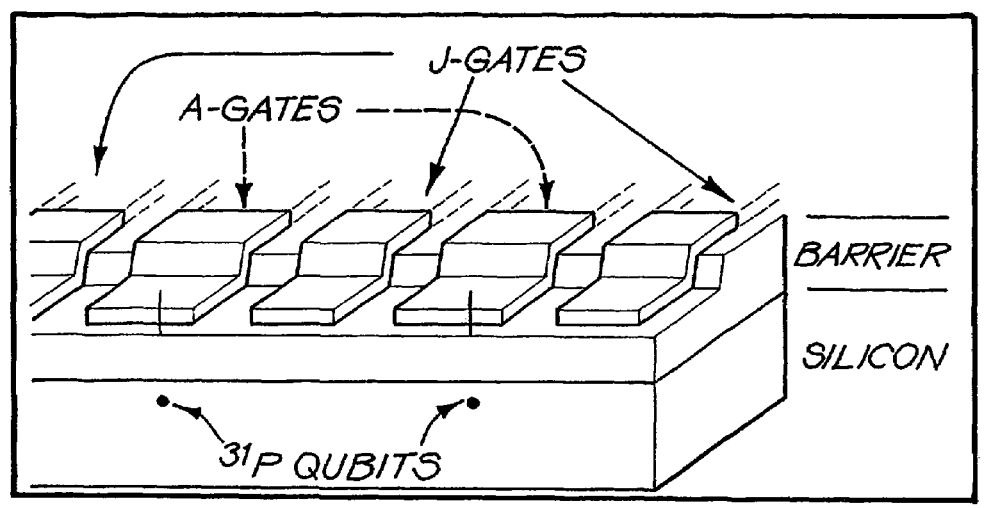
FIG. 1(a) is a schematic diagram of the Kane proposal for a silicon based quantum computer.
Figure 2A:
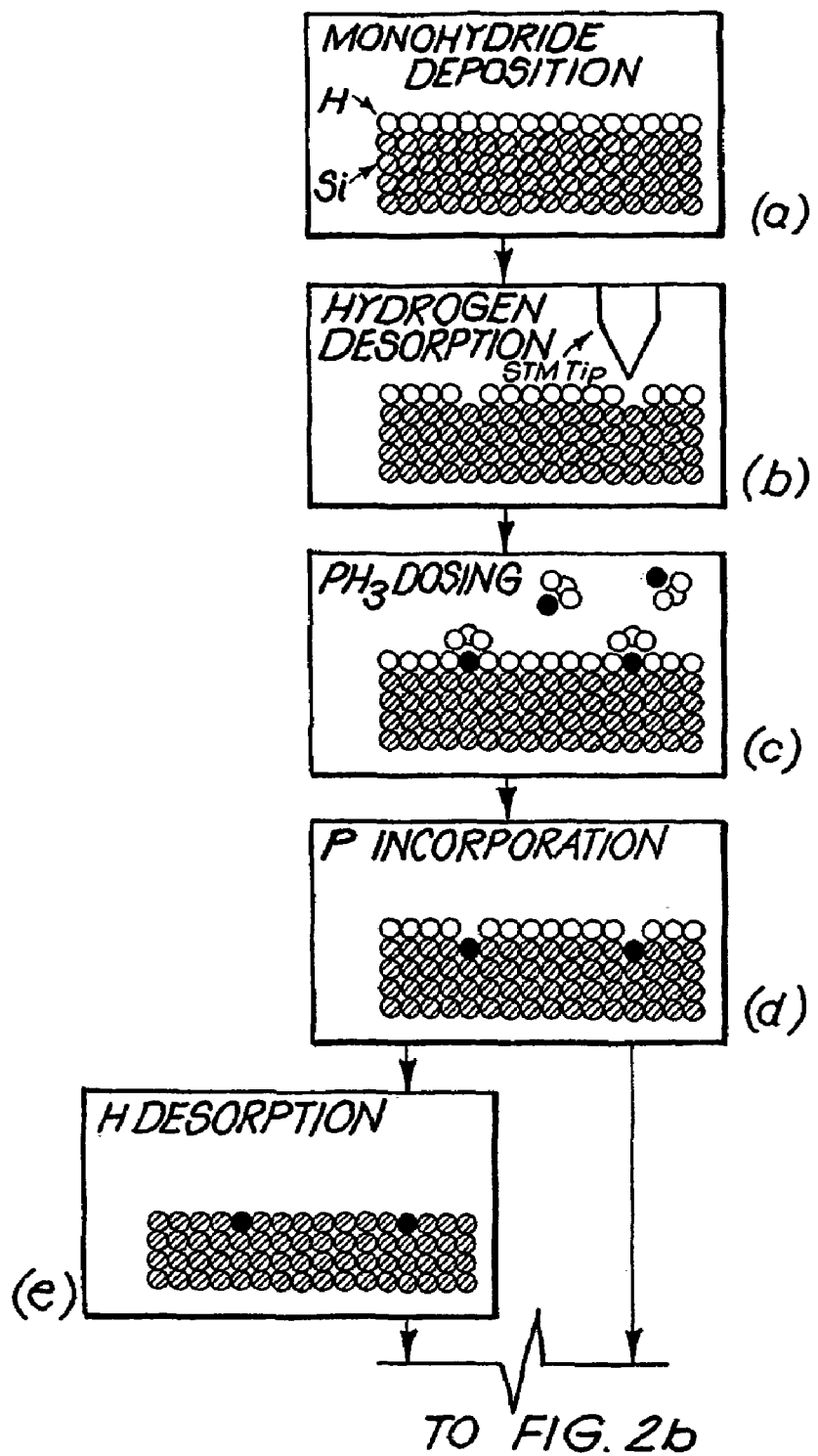

Referring first to FIG. 2, it outlines the individual processing steps for the fabrication strategy. A clean Si(100)2×1 surface is formed in an ultra-high-vacuum (UHV) by heating to near the melting point. This surface has a 2×1 unit cell and consists of rows of σ-bonded Si dimers with the remaining dangling bond on each Si atom forming a weak π-bond with the other Si atom of the dimer of which it comprises.

Exposure of this surface to atomic H can break the weak Si π-bonds, allowing H atoms to bond to the Si dangling bonds. Under controlled conditions a monolayer of H can be formed with one H atom bonded to each Si atom, satisfying the reactive dangling bonds, effectively passivating the surface; see FIG. 2(a).

Figure 2B:
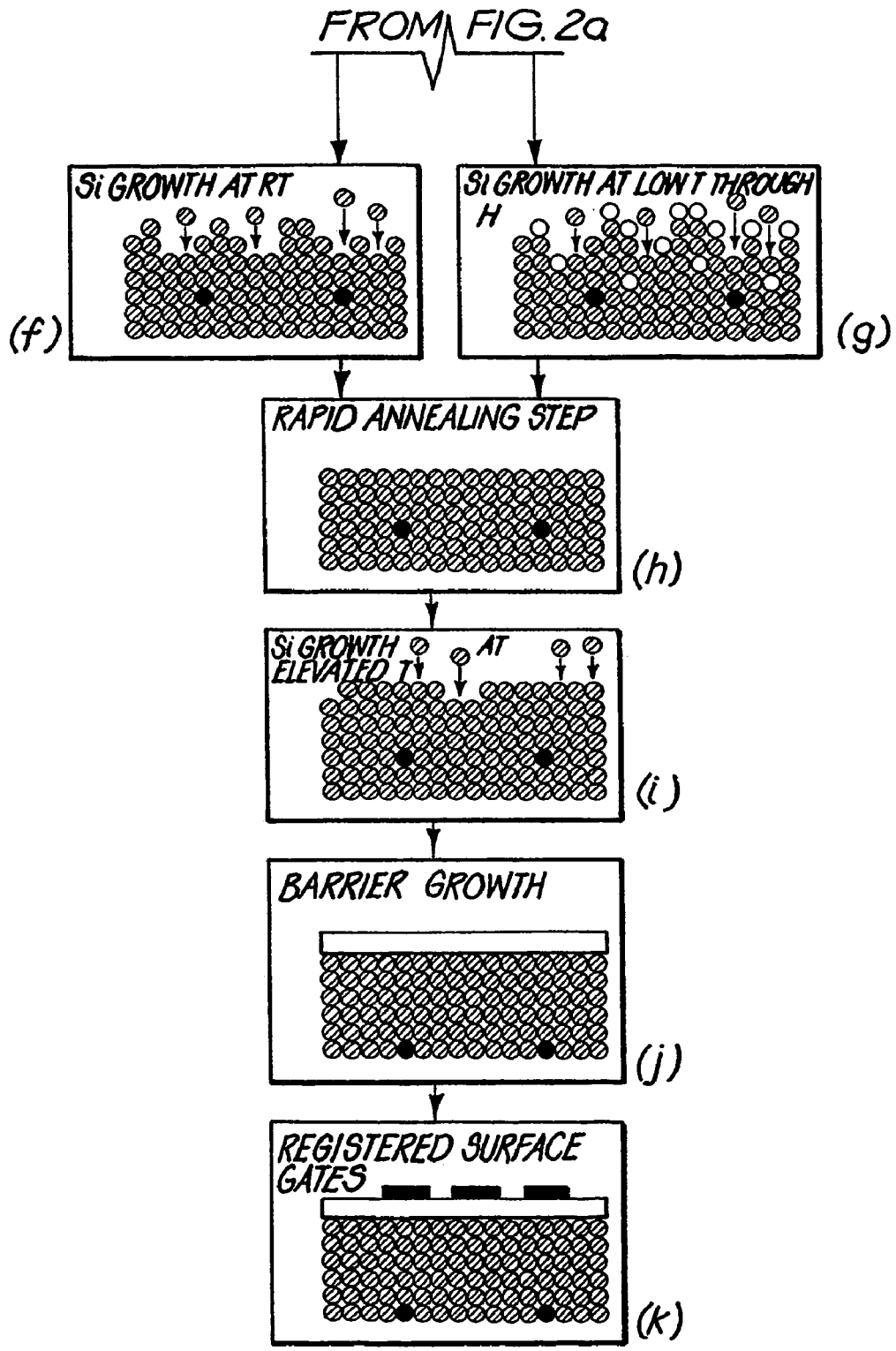

An STM tip is then used to selectively desorb H atoms from the passivated surface by the application of appropriate voltages and tunneling currents, forming a pattern in the H resist; see FIG. 2(b). In this way regions of bare, reactive Si atoms are exposed, allowing the subsequent adsorption of reactive species directly to the Si surface.

Phosphine ($PH_3$) gas is introduced into the vacuum system via a controlled leak valve connected to a specially designed phosphine micro-dosing system. The phosphine molecule bonds strongly to the exposed Si(100)2×1 surface, through the holes in the hydrogen resist; see FIG. 2(c).

Subsequent heating of the STM patterned surface for crystal growth causes the dissociation of the phosphine molecules and results in the incorporation of P into the first layer of Si; see FIG. 2(d). It is therefore the exposure of an STM patterned H passivated surface to $PH_3$ that is used to produce the required P array.

The hydrogen may then be desorbed, as shown in FIG. 2(e), before overgrowing with silicon at room temperature, as shown in FIG. 2(f). An alternative that has been discarded is to grow the silicon directly through the hydrogen layer, as shown in FIG. 2(g).

The next step is to rapidly anneal the surface, shown in FIG. 2(h).

Silicon is then grown on the surface at elevated temperature, shown in FIG. 2(i). A barrier is then grown as shown in FIG. 2(j). Finally conductive gates are aligned on the surface, as shown in FIG. 2(k).

There are a number of challenges to be met in this fabrication scheme. In all of the processes outlined above, introduction of charge and spin impurities is likely to be fatal to the operation of the quantum computer. Preparation of large areas of defect free Si(100)2×1 on which to fabricate the P array is necessary. It is also essential to produce a complete coverage of the Si surface with H with controlled desorption so that $PH_3$ adsorbs only at the desired sites. A detailed description of how each of these challenges has been met is described below.

Preparation of Low Defect Density Surface

The (100) surface is well characterised and is the most suitable surface for silicon growth, and as such was chosen as the most suitable candidate on which to attempt placement of an atomically precise phosphorus array for fabrication of the Kane quantum computer.

The system used in this work is a three chamber Omicron UHV variable temperature (VT) STM multiprobe RM system. For the surface passivation stage an atomic hydrogen source is attached to the analysis chamber, consisting of a tungsten filament, water cooled heat shroud and leak valve. Phosphine gas is introduced to the chamber via a UHV leak valve and double containment gas lines.

A separate chamber within the same vacuum environment houses a commercial silicon deposition cell. This instrument allows for surface preparation, placement of phosphorus arrays and subsequent silicon overgrowth all within the one UHV environment.

Silicon samples of 2×10 $mm^2$ dimensions were cleaved from commercially available phosphorus doped n-type silicon wafers with resistivities of 1–10 Ωcm for use in Omicron direct heating STM sample holders. The sample surfaces were prepared under UHV conditions by following a standard thermal preparation procedure[4] involving the following steps: (i) The samples were outgassed for 6 hours at ~600° C. by indirect heating using a resistive heating element mounted behind the sample holder and outgassed for 3 to 6 hours by direct current heating to a temperature below 600° C. (ii) The samples were flashed to ~1200° C. for 30 to 60s by passing a DC current directly through the sample. This step removes the native oxide layer from the surface and allows the surface silicon atoms to become mobile. (iii) The sample temperature was reduced to ~950° C. and then cooled slowly from ~950° C. to room temperature. It was found that the surface defect density was strongly dependent on the final cool down rate, as has been reported previously[4]. The sample temperature was monitored throughout this procedure using an infrared pyrometer. After the initial outgassing, the pressure in the vacuum chamber remains in the low $10^{10}$ mbar region or lower (including during flashing to 1200° C.).

Figure 3A:
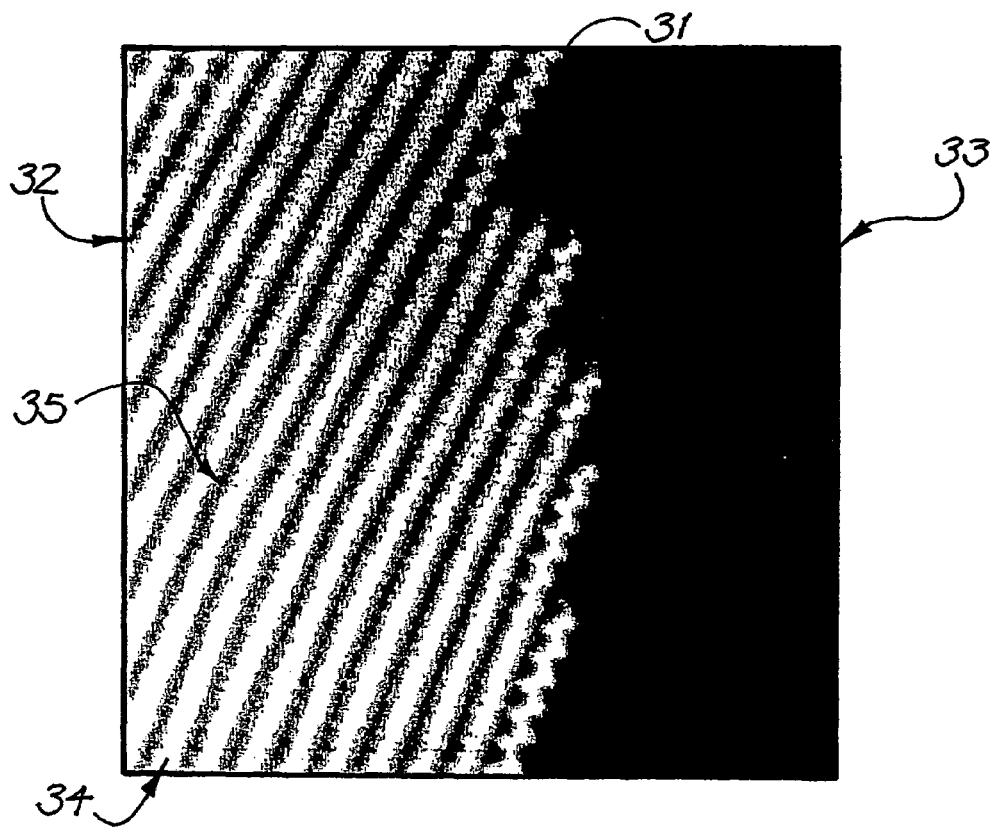
FIGS. 3(a) and (b) are an STM image and a schematic diagram showing a crystalline silicon(100) 2×1 surface.

FIG. 3(a) shows a typical STM image of a low defect density Si(100)2×1 surface, prepared according to the above procedure. One monatomic step 31 is visible to create two flat (100) terrace regions 32 and 33. The upper terrace 32 is clearly visible, while the lower terrace 33 is hard to see, but it is possible to see that the dimer rows 34 in the two terraces run at right angles to each other. Such steps exist because of a slight misorientation of the surface plane with respect to the (100) crystal direction. It is not possible to produce a completely defect free surface[5], however, the defect density of the surface shown in FIG. 3(a) is approximately 1% which is consistent with the lowest defect density surfaces reported in the literature (eg., Ref.5). This image was acquired with a negative sample bias and as such is a filled state image with individual dimers appearing as bean shaped protrusions 35 attributed to tunneling from the π-bond of the dimer[6].

Figure 3B:
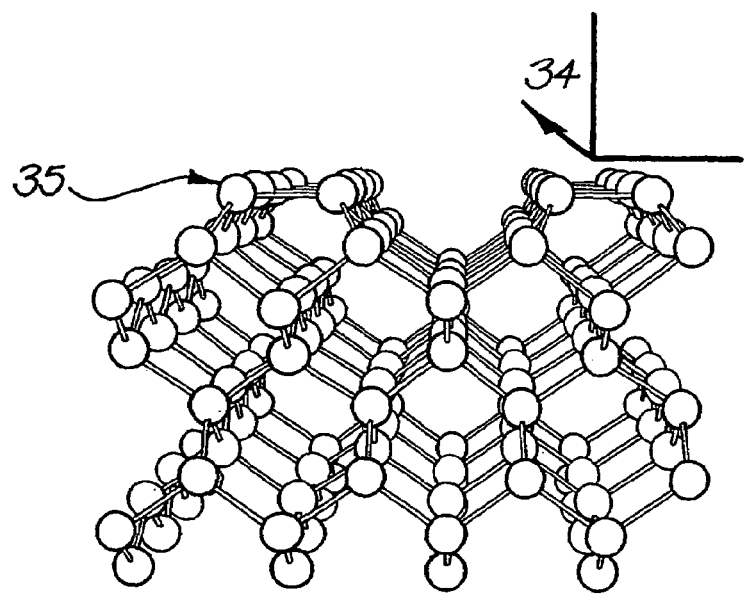

FIG. 3(b) is a 3 Dimensional diagram of the structure of crystalline silicon.

Hydrogen Resist

The next stage of the fabrication procedure is to passivate the Si(100)2×1 surface with hydrogen. In order to do this we use an atomic hydrogen source (AHS). The AHS filament is heated to ~1500° C. and a gas flow from a source of 99.999% pure molecular hydrogen is passed through the AHS via a leak valve into the UHV chamber. The AHS converts a significant fraction of the molecular hydrogen to atomic hydrogen, and the atomic hydrogen then reacts with the sample surface, forming the passivation layer. The dose rate is controlled by monitoring the total pressure in the UHV chamber. The purity of the gas being introduced to the chamber is monitored using a mass spectrometer.

Due to the very weak nature of the silicon dimer $\pi$ bond, the Si(100)2×1 surface is very reactive. Hydrogen atoms impinging onto the Si(100)2×1 surface break the weak dimer $\pi$ bond[7], creating two reactive surface sites where hydrogen atoms may adsorb. A dimer with only one H atom adsorbed is called a hemihydride dimer. The silicon atom of the dimer that is not hydrogen terminated is left with a dangling bond where a second hydrogen atom may adsorb. A silicon dimer that has been completely passivated with two hydrogen atoms is called a monohydride dimer.

Figure 4A:
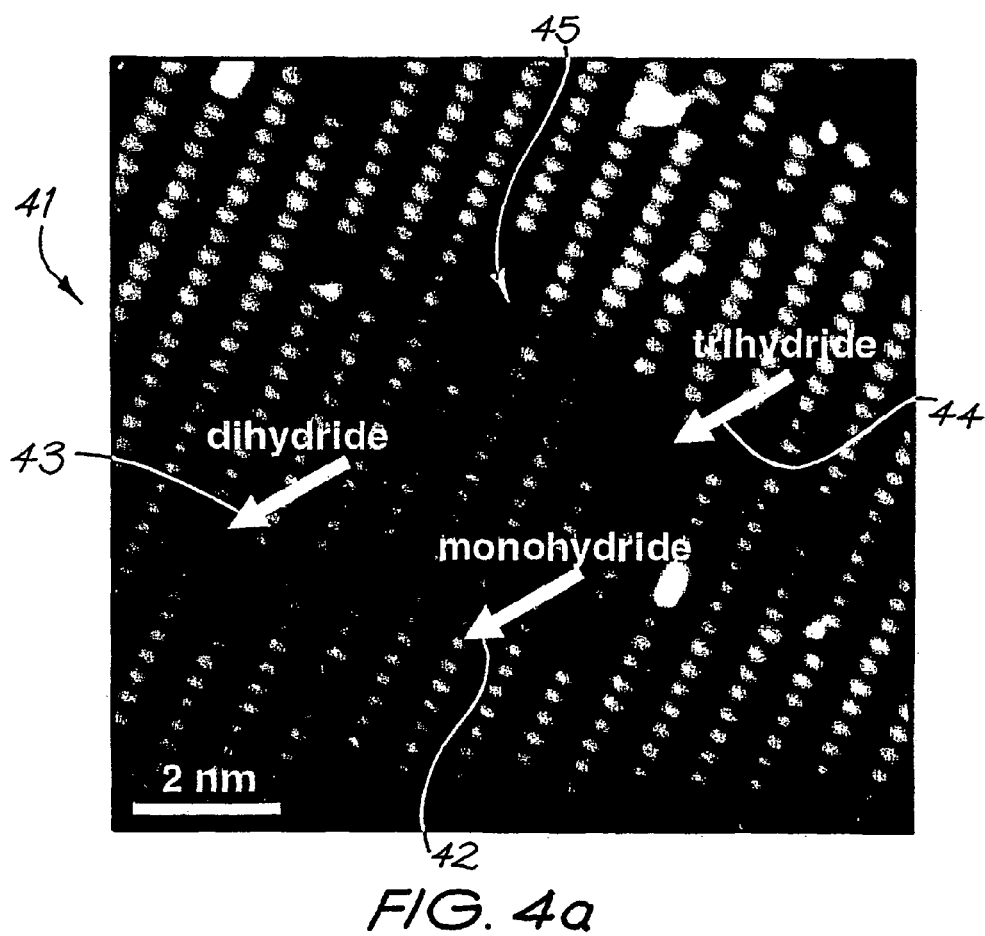
FIGS. 4(a) to (e) are an STM image, schematic diagrams and scanning tunneling spectroscopy results.

Several experiments were performed to determine the optimal hydrogen dosing conditions to obtain a uniform monohydride layer. FIG. 4(a) is an STM image of a passivated surface 41 where we have dosed the sample to a chamber pressure of $10^7$ mbar for half an hour with sample temperatures in the range of 300–400° C. During dosing the sample surface was positioned directly in front of the AHS UHV inlet at a distance of ~10 cm. The result is an almost uniform monydride 42 layer but having dihydride 43 and the combination 44 of these two phases, known as the H:(3×1) phase. In addition there are dimers missing at the surface at 45.

Figure 4B:
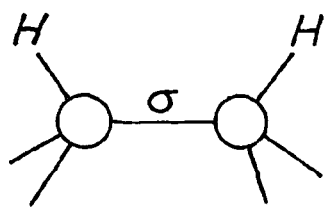

The monohydride 42 structure is shown in FIG. 4(b), and has both silicon atoms of the dimer terminated with hydrogen.

Figure 4C:
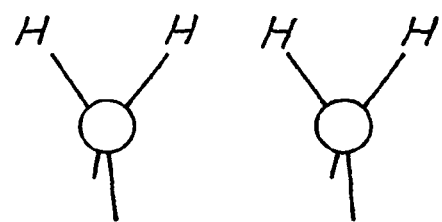
Figure 4D:
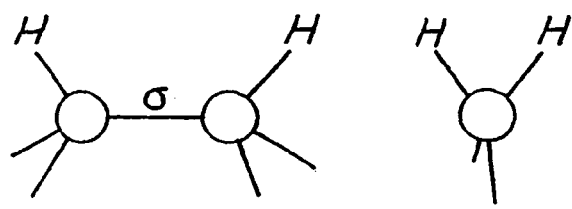
Figure 4E:
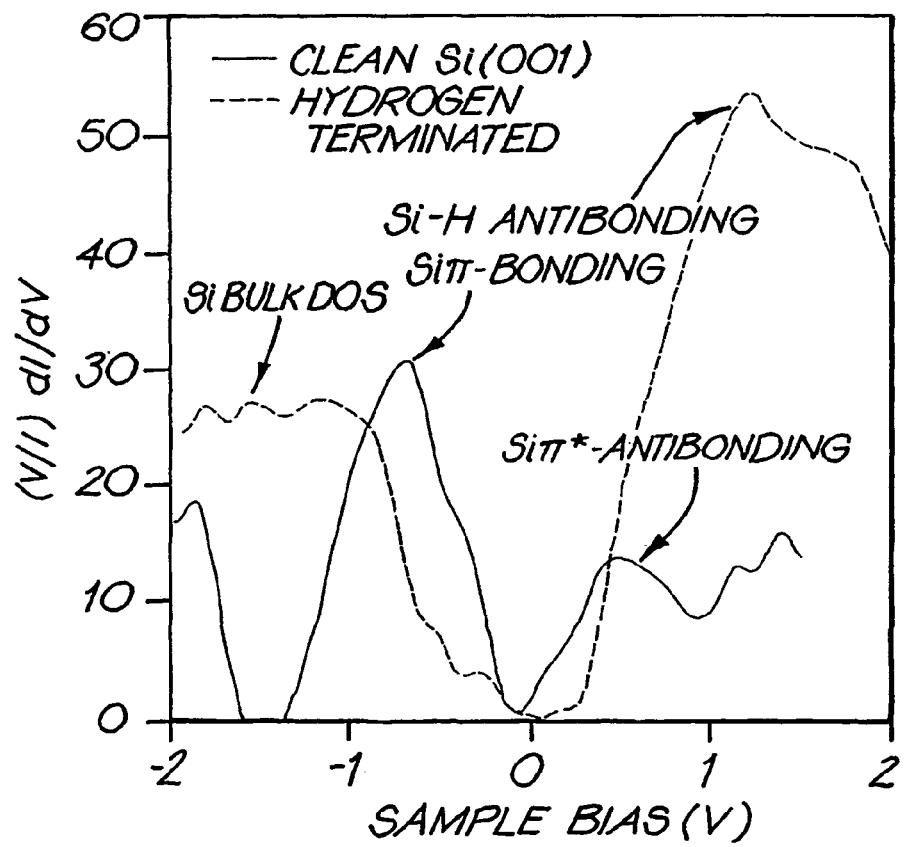

The dihydride 43 structure is shown in FIG. 4(c), and has each silicon atom bonded to two hydrogen atoms. In FIG. 4(a) this feature has the appearance of a dark spot.

FIG. 4 (d) shows the structure of the combination of these two phases 44, which are identified on the surface.

FIG. 4 demonstrates that we are able to controllably dose the Si(100) surface with hydrogen and identify the resultant surface species. However, to further demonstrate our ability to characterise the clean and hydrided surfaces we have performed a number of scanning tunneling spectroscopy STS) experiments[22]. We held the STM tip at a fixed location and distance from the surface (by disengaging the STM tip feedback mechanism) and ramped the tip bias through –2 V to 2 V, while measuring the tunnel current. FIG. 4(e) shows the results of these STS experiments for both the clean (FIG. 3(a)) and hydrogen terminated (FIG. 4(a)) surfaces. The clean surface spectroscopy shows both the $\pi$ bonding and $\pi^*$ antibonding peaks. The spectroscopy for the hydrogen terminated surface shows a broad shoulder associated with the silicon bulk density of states and a pronounced Si—H antibonding peak. Both of these results are in agreement with previous studies[8].

Hydrogen Lithography and Phosphorus Array

Following the formation of a monolayer of H on the Si surface the next step is to selectively desorb regions in the H resist using the STM tip. This will expose areas of the Si surface for the controlled placement of P atoms.

Achieving atomic resolution desorption places stringent requirements on the STM tip. Controlled desorption can be achieved by applying a large bias to the STM tip, however, it is also possible to desorb hydrogen whilst imaging, thereby exposing regions of the surface unintentionally. We demonstrate that we have overcome this obstacle to controllably and repeatedly desorb H in an array suitable for the fabrication of the Kane quantum computer.

In order to achieve atomic resolution desorption[6] a very sharp tungsten tip with a large cone angle is required[9]. In order to meet these requirements we have used a commercial tip etching device (Omicron W-Tek Semi-Automatic Tip Etching system). A length of W wire (diameter=0.38 mm) is inserted ~2 mm into a NaOH solution at the centre of a stainless steel cathode ring. Application of ~5–10 V between electrodes generates an electrochemical reaction which proceeds preferentially at the surface of the solution. Within ~10 min the wire is etched completely through leaving a small radius tip. A 2 min etch in hydrofluoric acid removes any oxide layer. The tip is inspected under an optical microscope to assess the geometry and, if satisfactory, loaded into the UHV system within 30 min to prevent formation of oxide. Other tip materials can be used such as PtIr and will be subject to similar preparation considerations.

An STM tip is used to desorb hydrogen from the surface by application of a controlled voltage pulse between the tip and sample. Careful optimisation of the geometry of the tungsten tip and controlled voltage pulses (sample bias ~6 V and tunneling current ~1 nA for ~1 ms) makes atomic resolution desorption possible. It is necessary to desorb an area with the correct phosphine dose so that one phosphine molecule and therefore only one phosphorus atom can bond in this area.

Figure 5B:
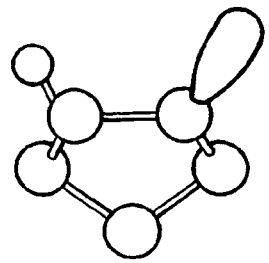
FIG. 5a to FIG. 5f are STM images, schematic diagrams and line profiles showing two dangling bonds arranged along a dimer row on a crystalline silicon surface before phosphine dosing and adsorbed $PH_3/PH_2$ molecules after phosphine dosing.
Figure 5A:
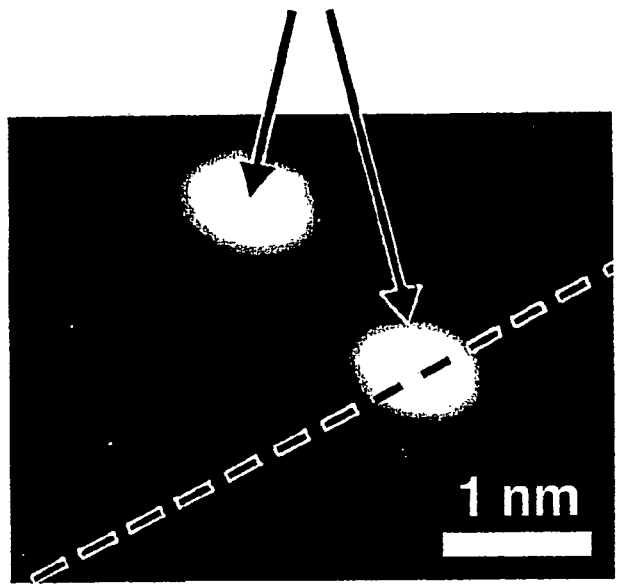

FIG. 5(a) is an STM image showing two desorption sites along a silicon dimer row (before phosphine dosing). The bright circles 51 in the image are two dangling bonds arranged along a dimer row. The desorption sites appear as bright protrusions as a result of the extension of electron density out of the surface due to the silicon dimer surface states of the exposed silicon dangling bonds. The remaining hydrogen on each silicon dimer is known to be transient[11] and we have observed it diffusing from one side of the dimer to the other with time. The next step is to fabricate the P arrays. Following STM lithography to expose small regions of the Si(100)2×1 surface phosphine gas is permitted into the chamber by a controlled leak valve such that individual phosphorus bearing molecules are adsorbed onto the exposed silicon surface.

In order to obtain high purity phosphine gas delivery, the $PH_3$ micro-dosing system and its connections to the UHV STM employed internally electro-polished gas lines assembled in a clean-room environment. Mass spectra taken in the chamber during the exposure at a pressure of $10^8$ mbar reveal no significant increase in the partial pressure of any other species. The sticking coefficient of phosphine on the clean silicon surface is 1[12].

Figure 5C:
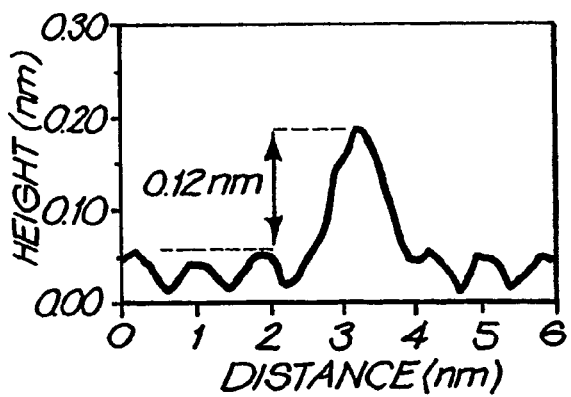
Figure 5E:
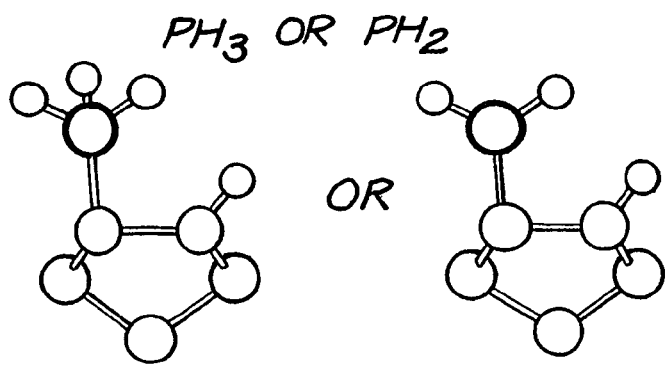
Figure 5D:
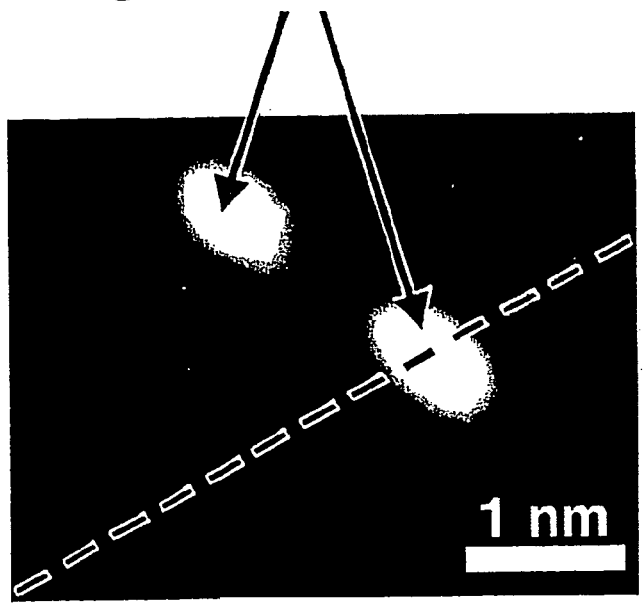

FIG. 5(b) is an STM image of phosphine molecules being adsorbed at the two dangling bond sites exposed (FIG. 5(a)) with one molecule adsorbed per dangling bond. FIG. 5(c) is a line profile across the dimer rows of FIG. 5(a) through one of the dangling bonds and shows the typical 0.12 nm height. FIG. 5(d) shows a line profile through one of the adsorbed phosphine molecules with a typical height of 0.17 nm.

FIG. 6(a) to (d) show equivalent images to FIG. 5 (a) to (d) but for three dangling bond sites perpendicular to the dimer row direction.

Figure 6B:
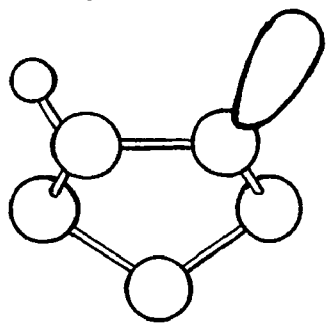
FIGS. 6(a) to (f) are STM images, schematic diagrams and line profiles showing dangling bonds arranged across a dimer row on a crystalline silicon surface before phosphine dosing and adsorbed $PH_3/PH_2$ molecules after phosphine dosing.
Figure 6A:
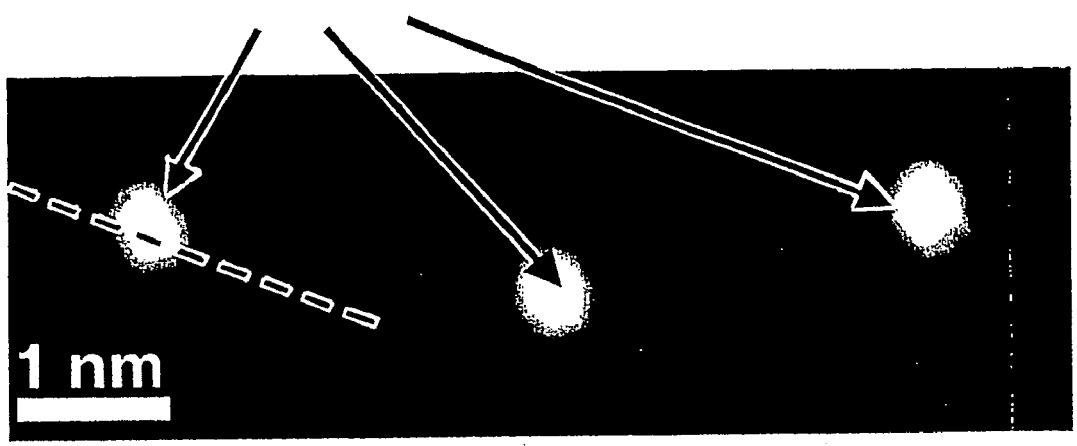
Figure 6C:
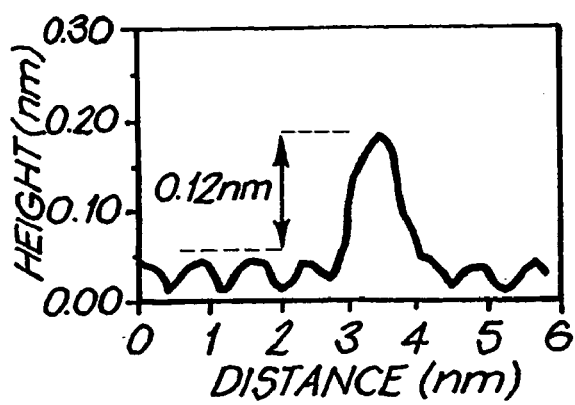

The STM images in FIGS. 5(a) and 6(a), with such a close spacing between sites, highlight the atomic resolution desorption achieved. The distance between sites can easily be increased to the required qubit spacing of 20 nm, and we have performed controlled lithography of single desorption sites in a line >100 nm in length. The images demonstrate that these desorption sites are sufficient to allow only one phosphine molecule to bond to the surface at each site.

All images were acquired at a sample bias of −1.8 V and tunneling current of 0.4 nA.

Figure 6D:
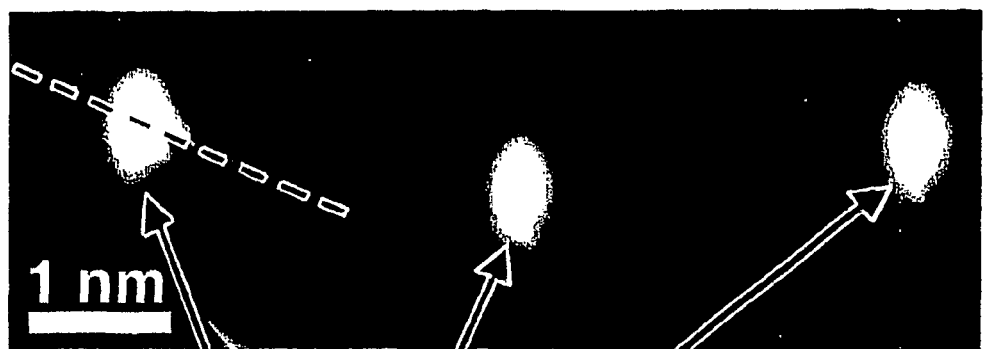
Figure 6E:
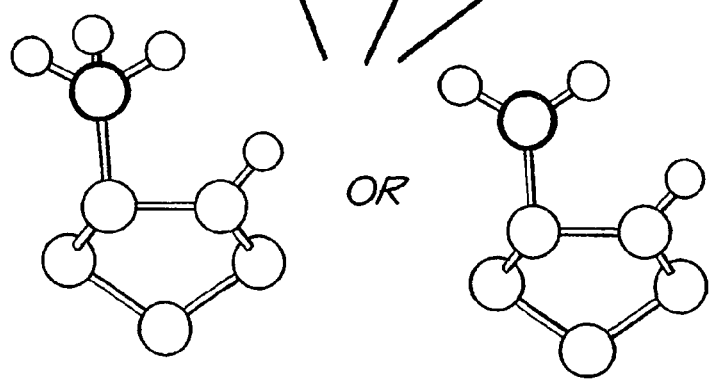

FIGS. 5(d) and 6(d) show the same area as FIGS. 5(a) and 6(a) after exposure to phosphine gas at room temperature.

The effectiveness of the hydrogen resist as a barrier to phosphine adsorption is demonstrated by the uniform hydrogen coverage after phosphine dosing except at the previously desorbed hydrogen sites. In order to observe any changes after phosphine exposure we have specifically chosen single hydrogen desorption sites, rather than larger desorption sites and present high resolution images where the spacing between sites is very small.

Figure 5F:
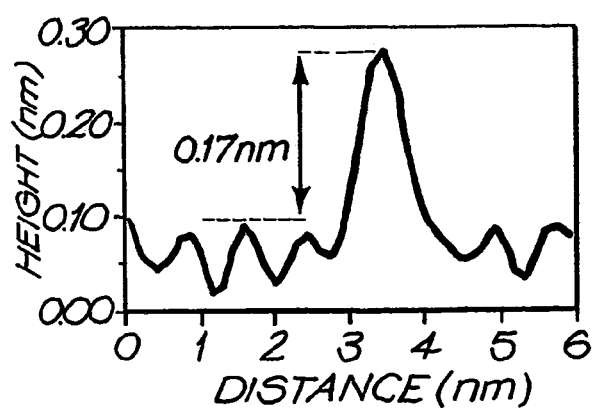
Figure 6F:
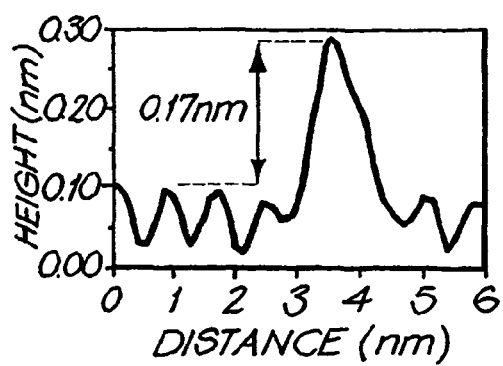

Analysis of the line profiles in FIGS. 5(f) and 6(f) show a characteristic increase of ~0.05 nm in the height of the protrusion after phosphine dosing. Such a difference can frequently occur due to minor changes in imaging conditions between scans, which results in the STM tip extending further into the gap between dimer rows. However the height difference due to $PH_3$ adsorption is measured from the top of the dimer rows to the top of the protrusion and is not therefore affected by this.

The ~0.05 nm height increases in the line profiles, observed at all adsorption sites over several images, was calibrated against an atomic step edge on the same surface (not shown) both before and after phosphine dosing. This reproducible increase confirms the adsorption of a $PH_3$ molecule and corresponds to the difference between the exposed silicon dangling bond and the adsorbed phosphine. The transient nature of the hydrogen atom on the silicon dimer can account for the asymmetry of the final image where one phosphine molecule has bonded to the left silicon atom in the dimer (upper) and another phosphine molecule has bonded to the right silicon in the dimer (lower).

Studies of the interaction of phosphine with clean Si(100) 2×1 surface[10, 13, 14] suggest that $PH_3$ molecularly adsorbs to one end of a silicon dimer and can then dissociate to $PH_2$ provided silicon dangling bonds are available nearby for the re-adsorption of the dissociated H. The absence of available dangling bond sites on the hydrogen-terminated surface can inhibit this dissociation step. A similar dissociative process and Si—$XH_2$ configuration is understood to occur in the adsorption of $NH_3$[15] and $AsH_3$[16] on the Si(100)2×1 surface, where both nitrogen and arsenic are isoelectronic with phosphorus.

The above results are important since for the first time we have demonstrated the effectiveness of the hydrogen resist as a barrier to phosphine adsorption and used this technique for the controlled placement of single phosphorus bearing molecules on a silicon surface—a central step in the construction of a silicon based quantum computer. This process, shown for closely-spaced controlled doping, demonstrates the achievability of more widely-spaced (~20 nm), precisely positioned phosphorus qubit arrays over large areas. This fabrication process is also applicable to the production of other micro- or nanoelectronic devices that could utilise ordered atom or dopant arrays.

Detection of $PH_x$ on the Si(100) Surface

Figure 7:
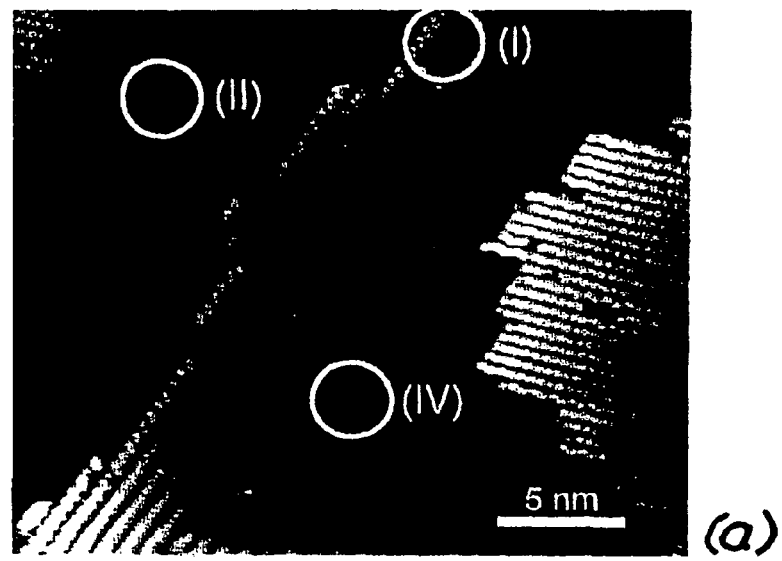
FIGS. 7(a) to (e) are STM images of a silicon (100) surface showing a number of defects.

In order to understand the incorporation of phosphorus atoms from phosphine gas into the silicon (100)2×1 it is first necessary to be able to identify phosphorus related species on a silicon surface and distinguish these from other features on the surface, including Si(100) surface defects. FIG. 7(a) is an STM image of a silicon (100) surface showing a number of defects. The defects, which occur in several forms, are seen as dark features on the dimer rows and four such defects are characterised with filled and empty state imaging in FIG. 7(b) to (e). The fact that the defects (and any other feature on the surface) have a characteristic appearance in both filled and empty state images means that we can obtain a characteristic 'fingerprint' for each feature and thus distinguish one feature from another.

The images in FIGS. 7b to 7e are filled and empty state images of the following defects: (b) missing dimer defect, (c) multiple missing dimer defect, (d) C-defect, and (e) split-off dimer defect.

All images were obtained using a tunnelling current of 0.1 nA. The bias voltages used were (b) −1.8 V, (c) +1.6 V, (d) −1.8 V, (e) +1.2 V, (f) −1.8 V, (g) +1.2 V, (h) −1.3 V, (i) +1.2 V.

Figure 8A:
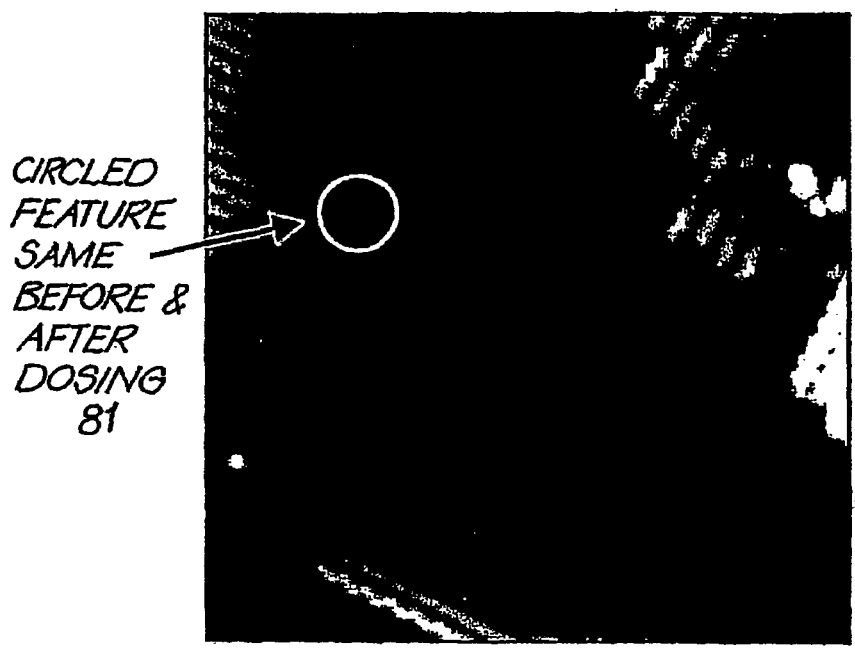
FIGS. 8a and b are STM images of a silicon (100) surface before and after phosphine dosing.
Figure 8B:
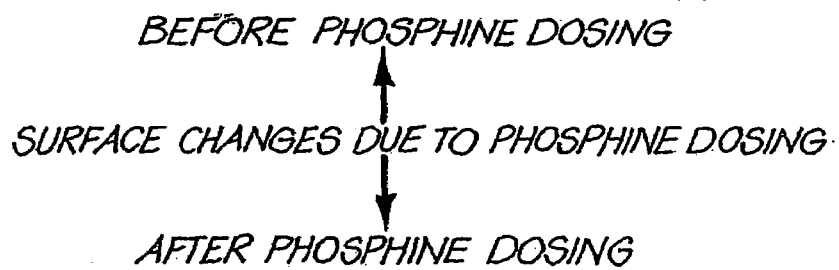
Figure 8B:
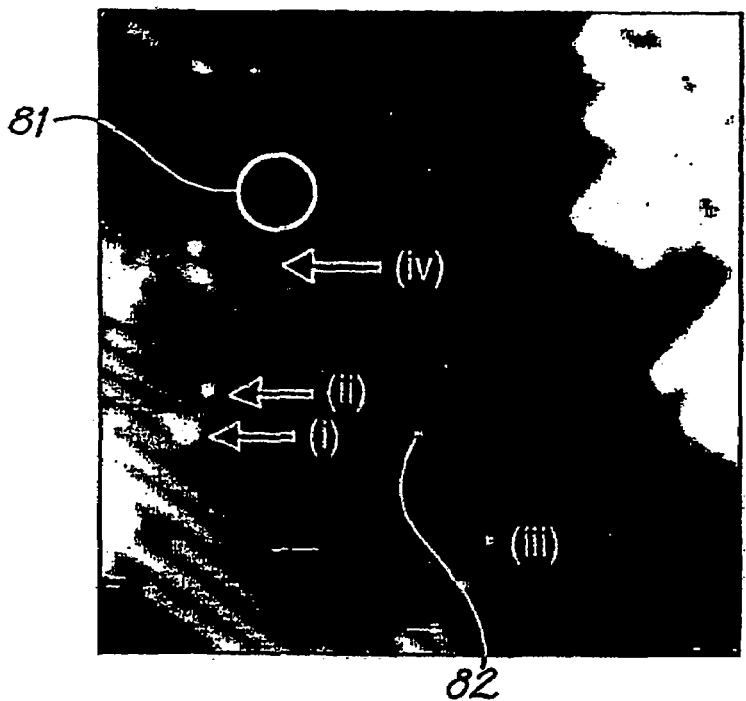

FIG. 8 shows a 25×25 $nm^2$ area of a Si(100) surface (a) before and (b) after the surface is exposed to a low dose of phosphine. Before dosing (FIG. 8(a)) there are a few defects on the surface. One such multiple missing dimer vacancy which is circled and labelled 81 is present after dosing. However, generally after dosing (FIG. 8(b)) it can be seen that most of the defects have changed in appearance and that the number of features on the surface has increased significantly. For instance a bright protrusion 82 has appeared. Such changes to the appearance of the surface result from the adsorption of $PH_3$ molecules and from species formed from the partial dissociation of $PH_3$.

The imaging conditions were (a) −1.6 V, 0.2 nA and (b) −1.6 V, 0.2 nA.

Figure 9A:
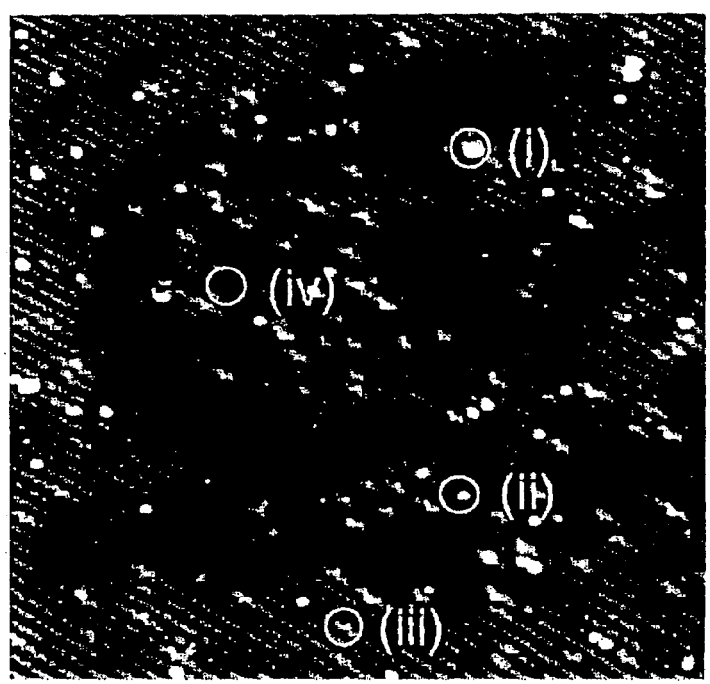

FIG. 9(a) shows a filled state STM image of a 50×50 $nm^2$ area of a Si(100) surface dosed with a low dose of $PH_3$. There are several features seen in the image that are not seen in images of the clean Si(100) surface. In order to characterise the adsorption species formed after $PH_3$ dosing we have performed high-resolution filled and empty state imaging of a $PH_3$ dosed surface. Studying the characteristic appearance of each of the features in filled and empty state images, and the apparent height of the features in the filled state images (see FIGS. 9(b) to (e)) we find that there are four new species. (b) and (c) are phosphorus containing molecules ($PH_x$ where x=2,3); (d) is a hemihydride i.e. a silicon dimer with one dangling bond saturated with a hydrogen atom and the other dangling bond unreacted. FIGS. 9 (biv), (ciii), (diii) and (eiii) show the features in empty state images. FIG. 9 (bii), (cii), (dii) and (eii) show height profiles of the features in filled state images discussed above.

All images were obtained using a tunnelling current of 0.1 nA. The filled (empty) state images were obtained with using a bias of −1.8 V (+1.2V).

Incorporation of P into the Surface—FIG. 2(d)

FIG. 10(a) shows a Si(100)2×1 surface dosed with a low dose of phosphine, it is similar to FIG. 9(a). FIG. 10(b) shows the surface after subsequent annealing to 350° C., FIG. 10(c) after annealing to 475° C. and FIG. 10(d) after annealing to 700° C.

After phosphine dosing, the features imaged on the surface in FIG. 10(a) are those described in FIG. 9(a).

After the 350° C. anneal the bright spots known to be phosphine molecules are gone. Large bright lines 101 perpendicular to the dimer rows were investigated by taking the filled state and empty state images shown in FIGS. 10(e) and (f) which revealed them to be 1-dimensional silicon dimer chains. The chains are made up from Si atoms that are ejected from the surface when P atoms are incorporated into the silicon to form Si—P heterodimers. The images in (e) and (f) were obtained using sample biases of −1.6 V and +1.6 V respectively.

Dark bars 102, more easily seen in the enlargement of FIG. 10(g), are monohydrides, and their structure is illustrated in FIG. 10(h).

Zigzag patterns 103, again more easily seen in the enlargement of FIG. 10(g), are the Si—P heterodimers, and their structure is illustrated in FIG. 10(i).

After annealing to 475° C. the silicon chains 101 have disappeared and after annealing to 700° C. the monohydrides 102 and Si—P heterodimers 103 are no longer present on the surface.

Figure 10:
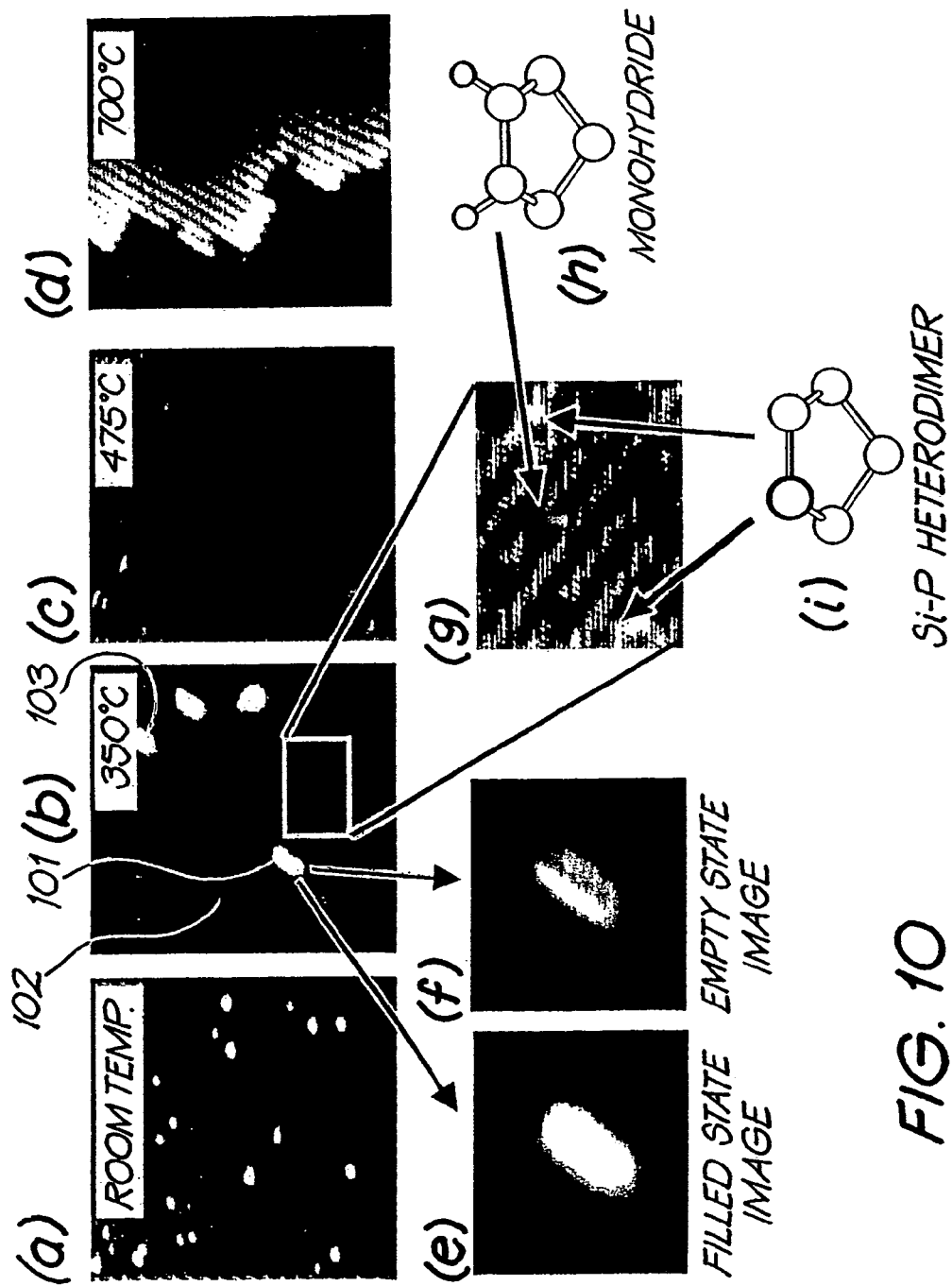
FIGS. 10(a) to (i) are a series of STM images and schematic diagrams showing a silicon surface after the phosphine dosing and the effect of heating that surface.

The images in FIG. 10 provide detailed analysis of what reactions are occurring at the silicon surface as a function of temperature. At room temperature phosphine adsorbs onto the surface as $PH_3$, most of which quickly dissociates to form $PH_2$ and H. Heating this surface to 350° C. sees dissociation of the $PH_x(x=2-3)$ to form a P—Si heterodimers, involving the incorporation of P atoms into the surface layer and the ejection of Si from the surface layer onto the surface to form 1-dimensional Si chains. The dissociation of $PH_x$ also results in the adsorption of H onto the surface in the monohydride phase. When the surface is heated to 475° C. the Si atoms in the 1-dimensional chains are supplied with enough energy to diffuse to step edges so the chains disappear from the surface. Once the surface temperature has been raised to 700° C. the monohydrides and the P atoms have desorbed from the surface, as $H_2$ and $P_2$, respectively.

A clear demonstration of the fact that it is possible to incorporate P into the top layer of a clean Si(100) surface is provided in FIG. 11. The diagram of FIG. 11(a) explains what is shown in the filled state STM image of FIG. 11(b), namely, a pair of P containing molecules after adsorption onto the bare Si(100) surface. This is confirmed by the line profile of FIG. 11(c).

Figure 11A:
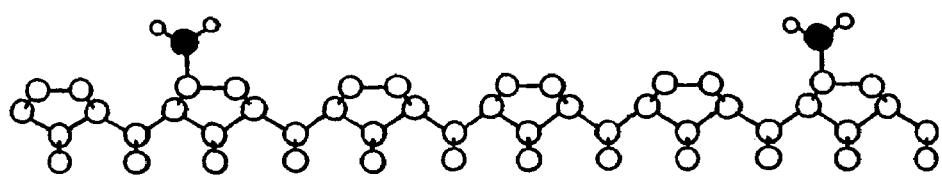
FIGS. 11(a) to (f) are a series of diagrams, STM images and line profiles showing phosphine molecules on the surface of a silicon lattice and incorporated into it.
Figure 11B:
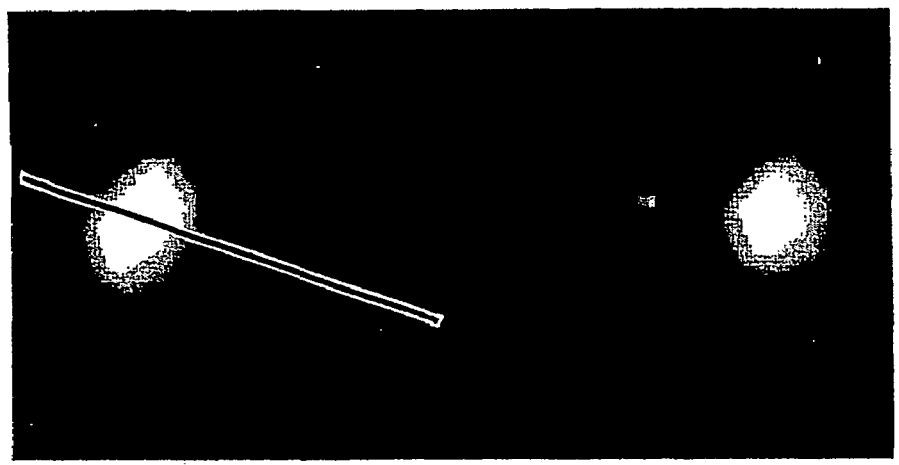
Figure 11C:
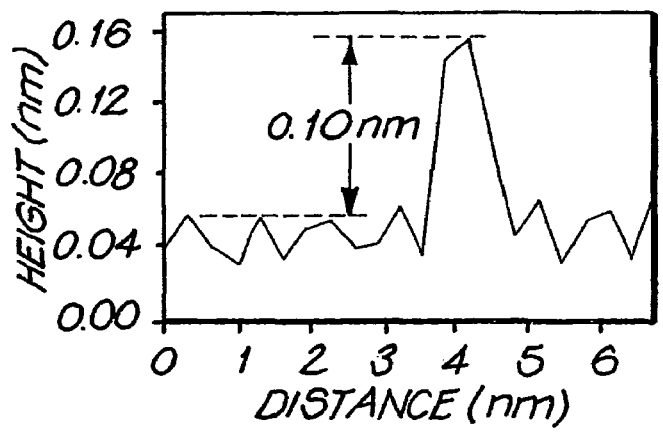
Figure 11D:
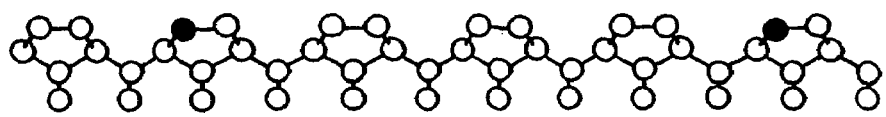
Figure 11E:
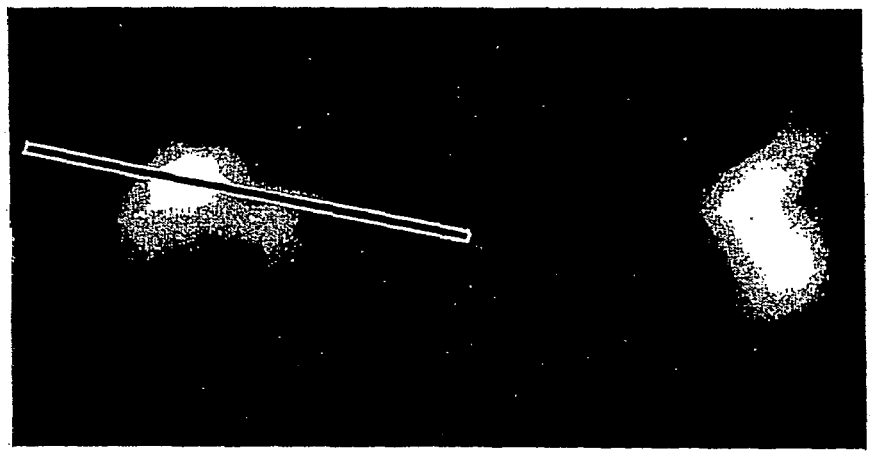
Figure 11F:
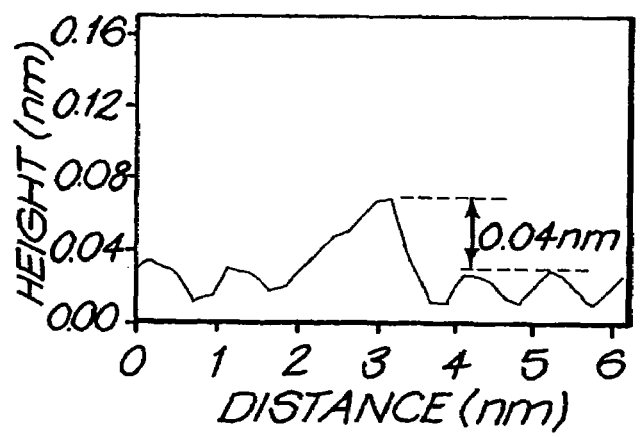

By contrast, the diagram of FIG. 11(d) explains what is shown in FIG. 11(e), namely that a pair of P atoms have been incorporated into the surface as a result of annealing a phosphine dosed surface to 400° C. The line profile of FIG. 11(f), when compared to FIG. 11(c) show that there is a characteristic height difference of ~0.06 nm between the non-incorporated and incorporated P, with the former extending higher above the surface plane. The reason for this height difference is apparent from the schematic models in FIGS. 11(a) and (b), which show the P coordination geometry for the two cases.

Figure 12A:
FIGS. 12(a) to (c) are a series of STM images of the silicon surface after moderate phosphine doses and heating and Auger electron spectroscopy results showing a silicon surface after saturation phosphine dosing and heating.
Figure 12B:
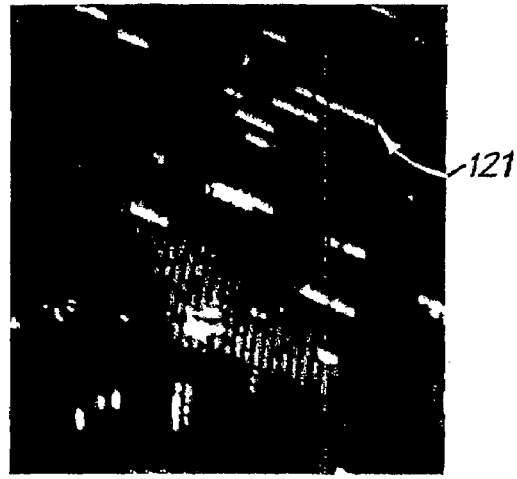

FIG. 12(a) is an STM image of a surface that has been given a low dose of phosphine and heated to 350° C., and shows the same features as FIG. 10(b). FIG. 12(b) is a similar image but the dosing was for six times as long. As a result the silicon chains 121 are much longer and more numerous, confirming that the ejected chains are related to the presence of P incorporated on the surface.

Figure 12C:
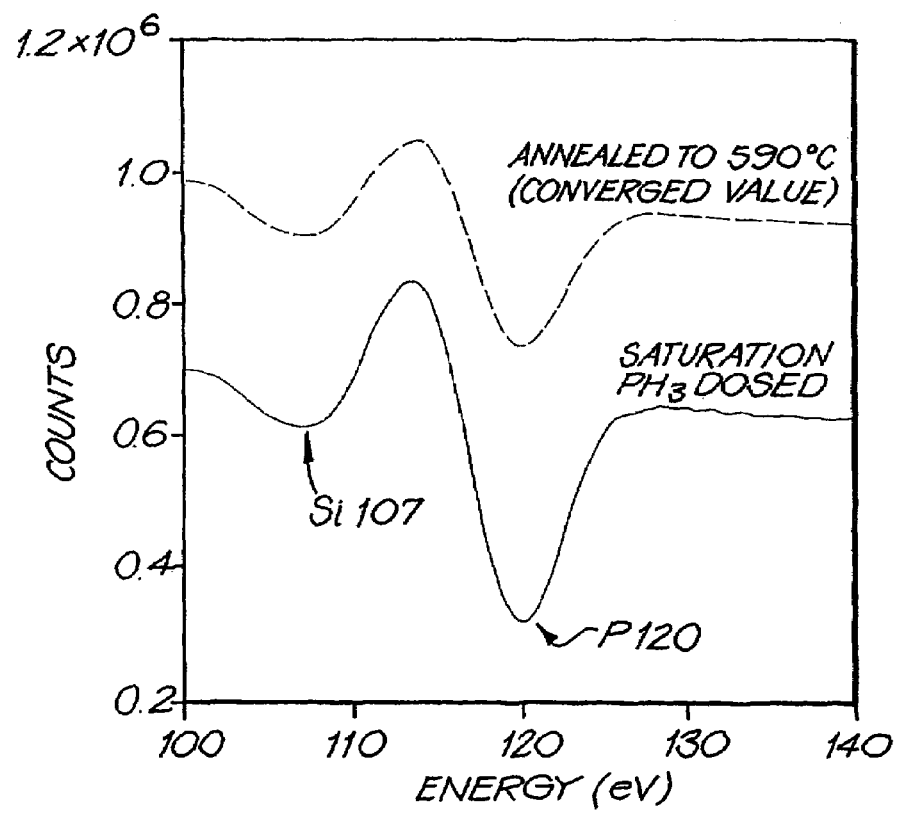

In order to confirm that P remains in the region of the surface after annealing we use a chemically specific technique, Auger electron spectroscopy (AES), to analyse the P dosed surface. The characteristic phosphorus AES peak at 120 eV was monitored for a succession of doses until the peak intensity became saturated, as shown at 122 in FIG. 12(c). The surface was then annealed to 590° C., which is approximately the upper limit of the temperature range used for P incorporation, and another AES spectra was taken, 123 as shown in FIG. 12(c). Although, the intensity of the P 120 eV peak has decreased by ~40%, possibly due to some desorption of physisorbed $PH_3$, its intensity is high enough to conclude that there is a significant amount of P in the region of the surface.

Incorporation of P into A Lithographically Defined Region

FIG. 13 shows STM based lithography using an H-passivation layer on Si(100) as a resist for spatially controlled adsorption of phosphine. Desorbing H with the tip of an STM results in the formation of a ~200×50 $nm^2$ "patch 131 and two ~100 nm long lines 132 and 133 of bare Si on the H-passivated surface, as shown in FIG. 13(a).

Figure 13A:
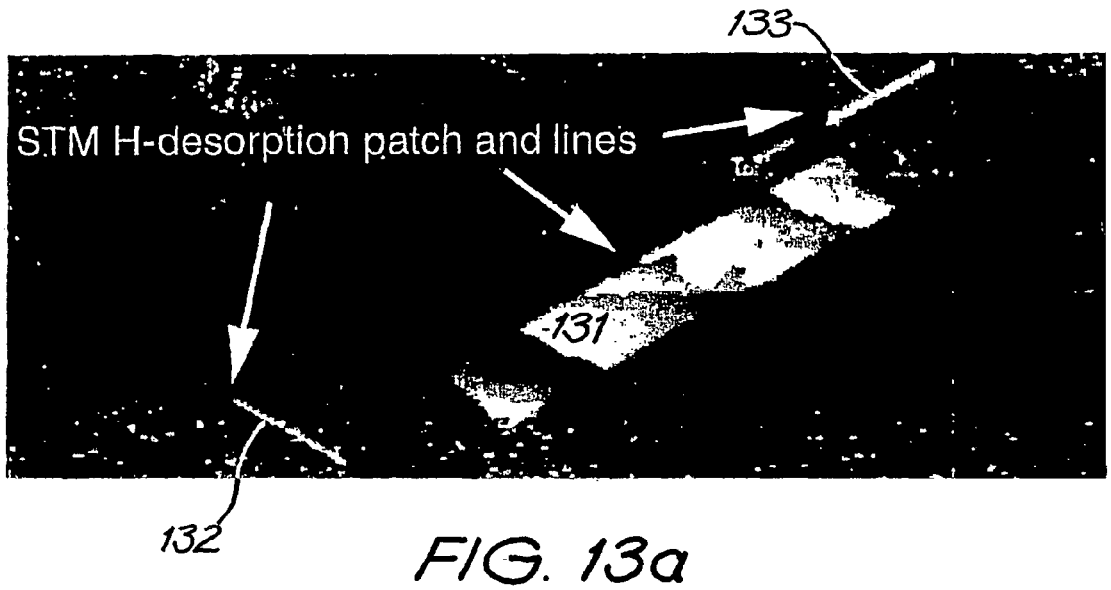
FIG. 13(a) shows an STM image of a hydrogen terminated silicon surface having a patch where hydrogen has been desorbed; (b) to (d) show a patch after annealing to 350° C.
Figure 13B:
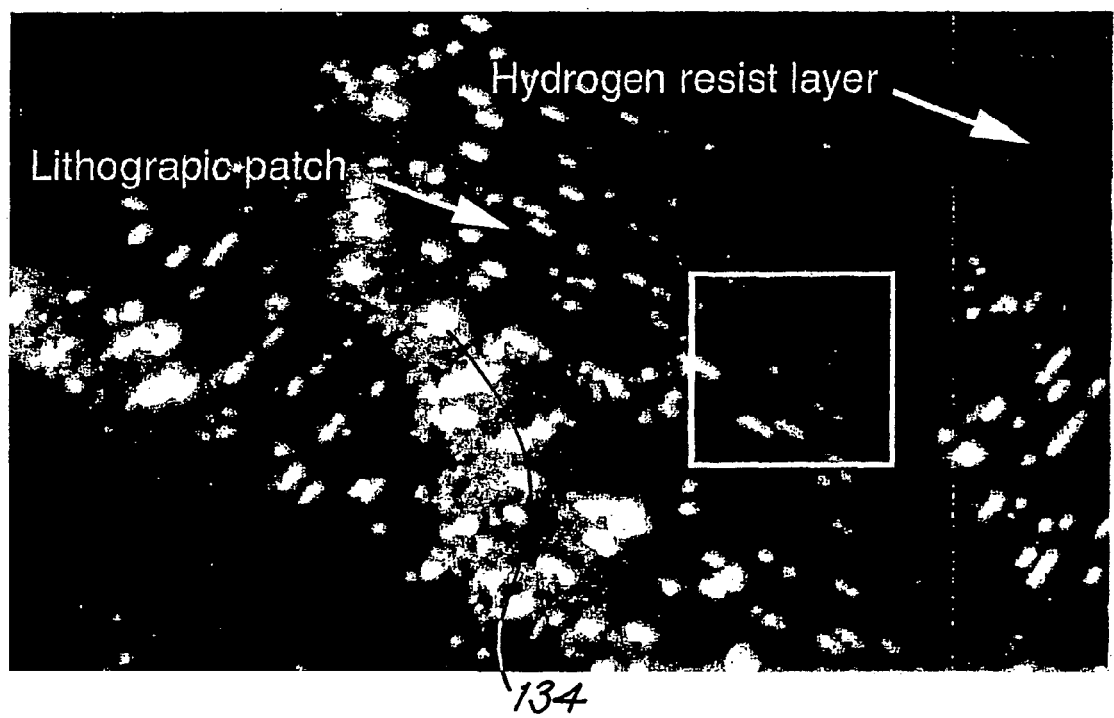

After dosing the surface with phosphine and annealing to ~375° C., the incorporation of P atoms into the surface, within the desorption patch, can be infered from the appearance of silicon dimer chains 134, see FIG. 13(b). However the H-termination of the surrounding surface has not been effected by the phosphine exposure.

Figure 13C:
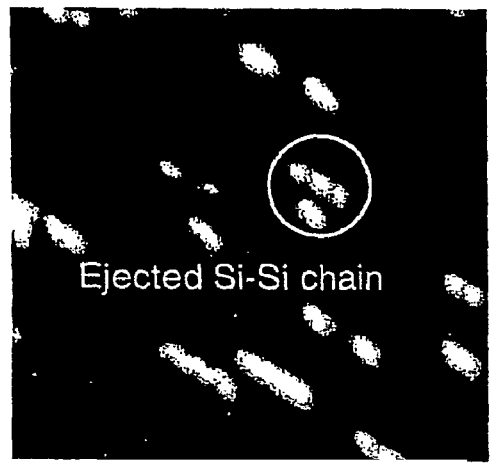
Figure 13D:
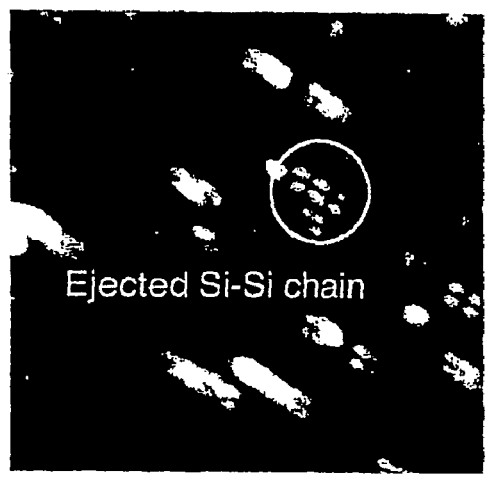

High resolution images of the dosed and annealed patch, shown in FIGS. 13(c) and (d) are filled and empty state images, respectively, of the area indicated by the box in (b). In the empty state image, the ejected Si—Si dimer chains show splitting characteristic of Si—Si dimers.

FIG. 14 demonstrates the incorporation of P dopant atoms along a lithographic line. FIG. 14(a) shows a ~1 nm wide line 141 of bare Si fabricated in a H-terminated Si(100) surface. Exposure to 0.3 Langmuirs of phosphine gas produces adsorption of $PH_x$ species and H, see FIG. 14 (b). After annealing to ~375° C. there is full dissociation of the $PH_x$ species. This produces further H adsorption and incorporation of P and ejection of Si. Some of the H repassivates the silicon surface to cause it to look darker in FIG. 14(c). FIG. 14 (d) and (e) show filled and empty state images, respectively, of the phosphine dosed and annealed line, and they confirm the appearance of a silicon dimer chain 142 in the region of the line. The characteristic splitting of the substrate H-terminated dimer rows is observed in the empty state image. Several single dangling bonds 144 appear as single bright protrusions in both filled and empty state images, as do several dangling bond pairs 145 which are due to bare Si—Si dimers on the surface.

Figure 14A:
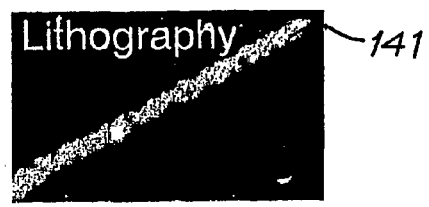
FIGS. 14(a) to (h) are a series of STM images and a line profile showing the effect of phosphine dosing and annealing to incorporate phosphorous atoms into a silicon lattice, along a lithographically produced line.
Figure 14B:
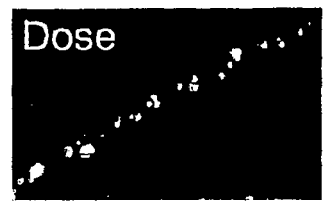
Figure 14C:
Figure 14D:
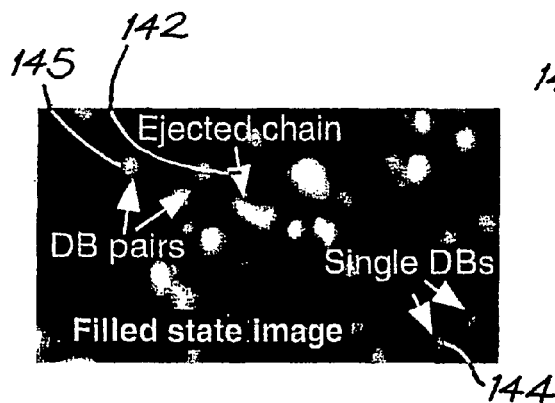
Figure 14E:
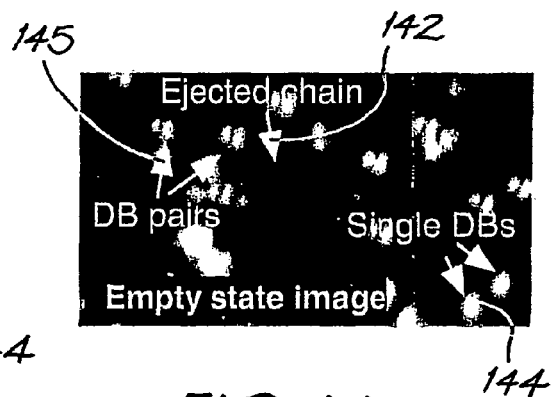
Figure 14F:

The single ejected dimer chain 142 is visible near the centre of the images. This chain is identified by the fact that it is oriented perpendicular to the substrate dimer rows and also that it splits into pairs of protrusions in the empty state. Unlike the bare silicon dimer chains seen in FIG. 13, this dimer chain is hydrogen terminated, as is evidenced by the fact that the intensity of the chain is comparable to the surrounding dangling bonds—a bare Si—Si dimer chain would be much brighter than the dangling bonds on the surface. The H to produce this termination comes from the dissociation of $PH_3$ molecules. FIG. 14(f) shows a high-resolution filled state image of the dosed and annealed line that has been contrast enhanced to highlight features of the surface that are otherwise overshadowed by the very bright dangling bonds of the surface. The arrows point to P—Si—H heterodimers, several of which have been formed along the length of the lithographic line.

Figure 14G:
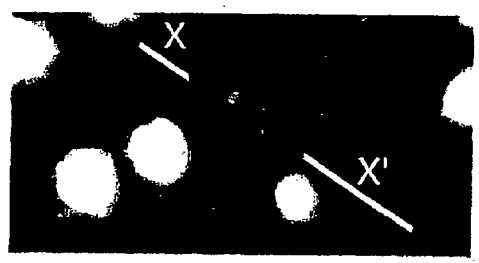
Figure 14H:
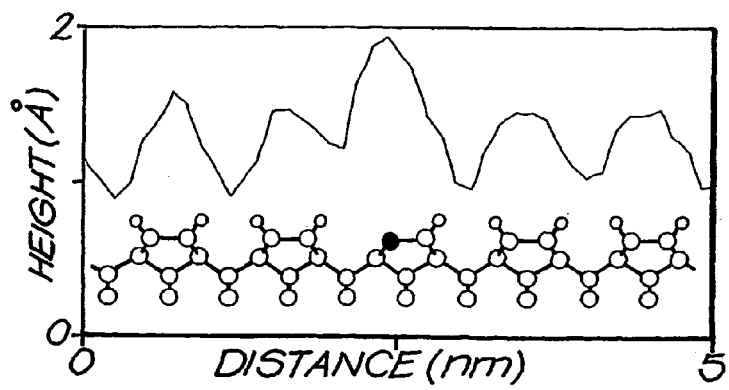

In FIG. 14(h) a line profile, obtained from between X and X' in FIG. 14(g), is displayed, along with a diagram of the part of the surface through which the line profile was obtained. The highest peak in the line profile results from the presence of a P—Si—H heterodimer. The above results show that we are able to incorporate P dopant atoms into the Si(100) surface with sub-nanometre accuracy at spatial locations defined using an STM.

Encapsulation of Incorporated P by High Purity Silicon

FIGS. 15 to 24 are all concerned with the silicon-encapsulation process, and in particular the best way to achieve an atomically smooth layer so that we can image the buried Si—P heterodimers and ensure that they do not move out of their arrays.

Growing Silicon—FIGS. 2(f) and (g)

FIG. 15 illustrates two approaches to the growth of silicon with no P present. FIG. 15(a) to (d) are concerned with encapsulation at room temperature and elevated temperatures. FIGS. 15(e) to (h) are concerned with encapsulation at room temperature and subsequent annealing. FIG. 15(i) to (k) show schematics which illustrate the temperature dependent epitaxial growth modes of silicon.

Figure 15A:
FIGS. 15(a) to (d) are a series of STM images showing the effect of growing silicon at different temperatures.

FIG. 15(a) shows silicon epitaxial layers with a thickness of about 12 monolayers on a Si(100)2×1 substrate deposited at room temperature. The mobility of silicon adatoms on the surface is strongly restricted by the low substrate temperature. Thus, the silicon adatoms stick on the surface close to the place where they were deposited from the gas phase and 3D Si islands form. This process is explained in the diagram of FIG. 15(k), where the random growth can be seen to result in a high surface roughness.

Figure 15B:

With increasing substrate temperature, the mobility of the Si adatoms on the surface increases and elongated Si islands grow. Depending on the substrate temperature several layers grow simultaneously:

At 220° C., shown in FIG. 15(b), three layers grow at one time, and the mechanism is explained in FIG. 15(j).

Figure 15C:
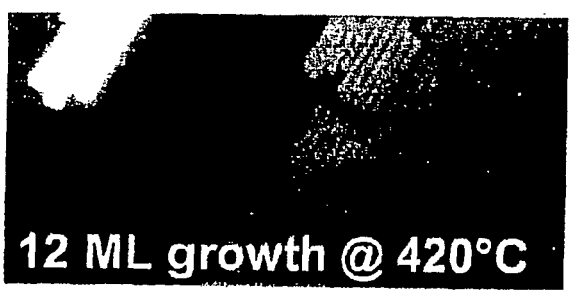

At 420° C., shown in FIG. 15(c), only two layers grow at one time.

Figure 15D:

At higher substrate temperatures, such as 590° C. shown in FIG. 15(d), Si grows in the step-flow growth mode, and the mechanism is explained in FIG. 15(i). Here the mobility of Si adatoms is high enough to diffuse on the terraces and to reach the step edges where they incorporate into the crystal. The result is a smooth crystalline surface in much the same way as a reconstructed Si(100)2×1 surface after sample flashing.

Figure 15E:
FIG. 15(e) to (h) are a series of STM images showing the silicon surface after growth at room temperature and annealing at different temperatures.
Figure 15F:
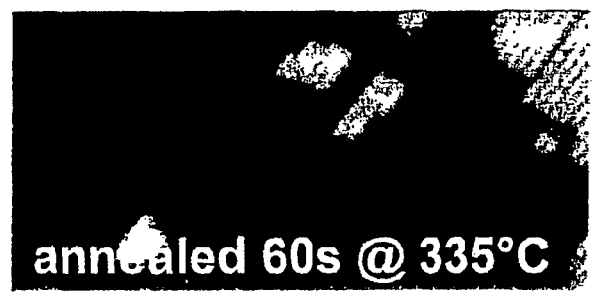
Figure 15G:
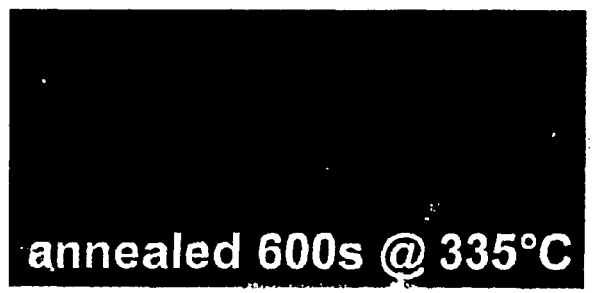
Figure 15H:
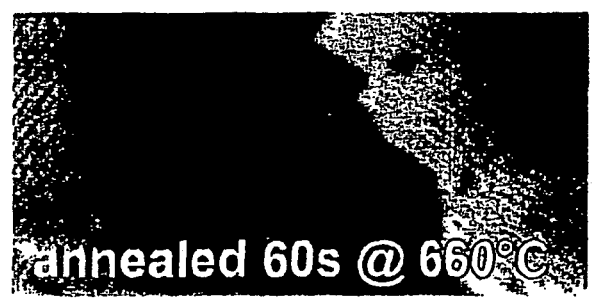

FIGS. 15(e) to (h) show an alternative encapsulation procedure. FIG. 15(e) is the same as FIG. 15(a). However, FIGS. 15(f) and (g) show the effect of annealing at 335° C. for 1 minute and additional 9 min, and FIG. 15(h) shows the effect of subsequent annealing at 660° C. for 1 minute.

Overall, surface roughness and defect density can be seen to decrease with increasing annealing temperature and time. Thus, the structural quality of the epitaxial Si layer increases with increasing growth or annealing temperature. The STM images in FIG. 15 show that similar surface morphologies are achieved with the two different approaches.

Figure 16A:
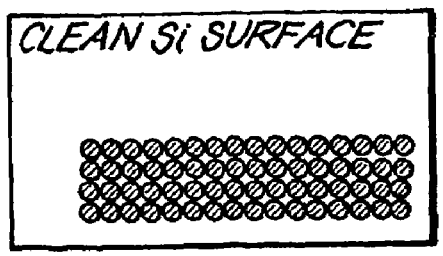
FIGS. 16a to f are a series of schematic diagrams and STM images showing the silicon surface before and after growth at 250° C. and subsequent annealing, the other, unlabelled images show the surface after growth and annealing at various temperatures.
Figure 16B:
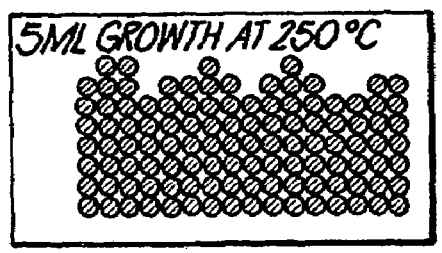
Figure 16C:
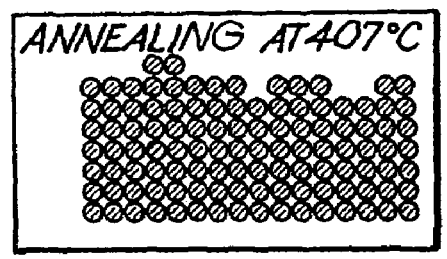
Figure 16D:
Figure 16:
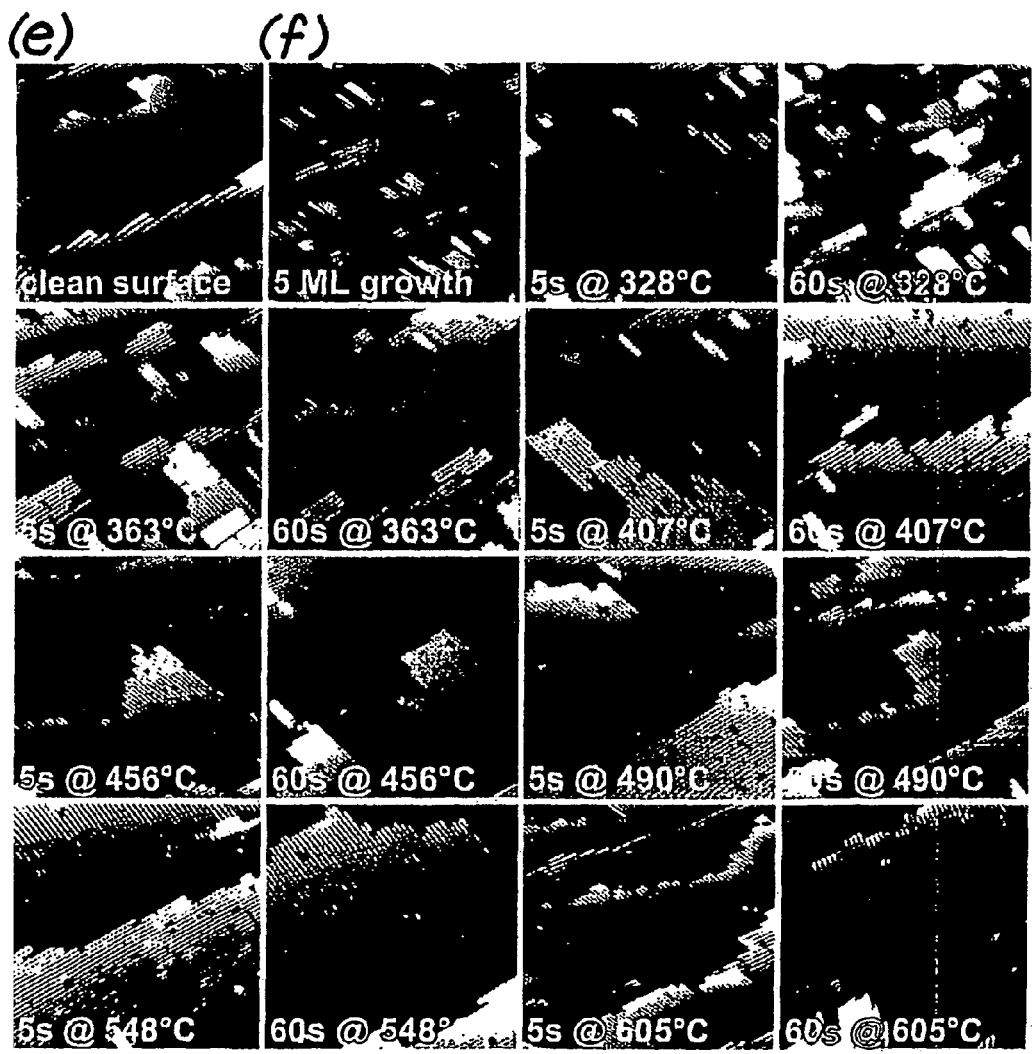

FIG. 16 shows the results of a more detailed study where five monolayers of silicon are grown at 250° C. and then annealed at different temperatures and times.

FIG. 16(a) is a schematic and FIG. 16(e) shows the corresponding filled state STM image of the Si(100) surface before any silicon growth.

FIG. 16(b) is a schematic and FIG. 16(f) is the corresponding filled state STM image of the Si(100) surface after Si growth of 5 monolayers (ML) at 250° C. At a substrate temperature of 250° C., silicon grows in the layer-by-layer growth mode.

The remaining images in FIG. 16 show the results after various annealing steps. The rough surface structure is still clearly visible after annealing at 328° C. Annealing at 363° C. and 407° C. leads to the formation of a terrace structure similar to the structure of the clean Si surface. However, the terraces contain small Si islands, vacancy areas, and antiphase domain boundaries. The surface also displays a high density of missing dimer defects. After additional annealing at 456° C. and 490° C. mobile single missing dimers formed multiple missing dimer defects. Further annealing at 548° C. and 605° C. recovers the initial terrace structure of the Si(100) surface without Si islands or holes, however, the density of missing dimer defects is significantly higher than on the initial clean Si surface after flashing. The image size of the STM images is 50×50 nm$^2$.

Figure 17A:
FIGS. 17a to g are a series of diagrams and STM images showing the silicon surface before and aftersilicon growth at 250° C. on a hydrogen passivated surface and subsequent annealing steps, the other, unlabelled images show the surface after growth and annealing at various temperatures.
Figure 17B:
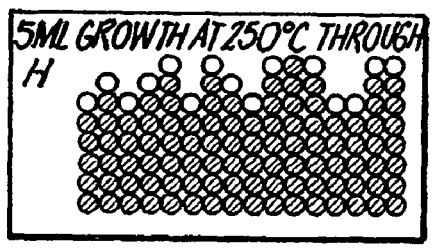
Figure 17C:
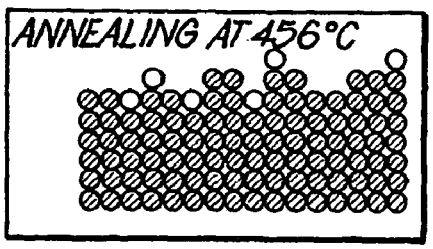
Figure 17D:
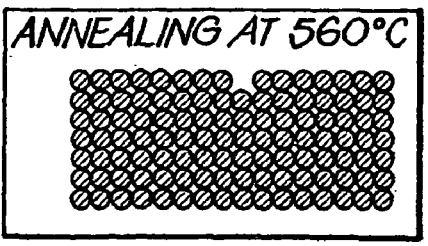
Figure 17:
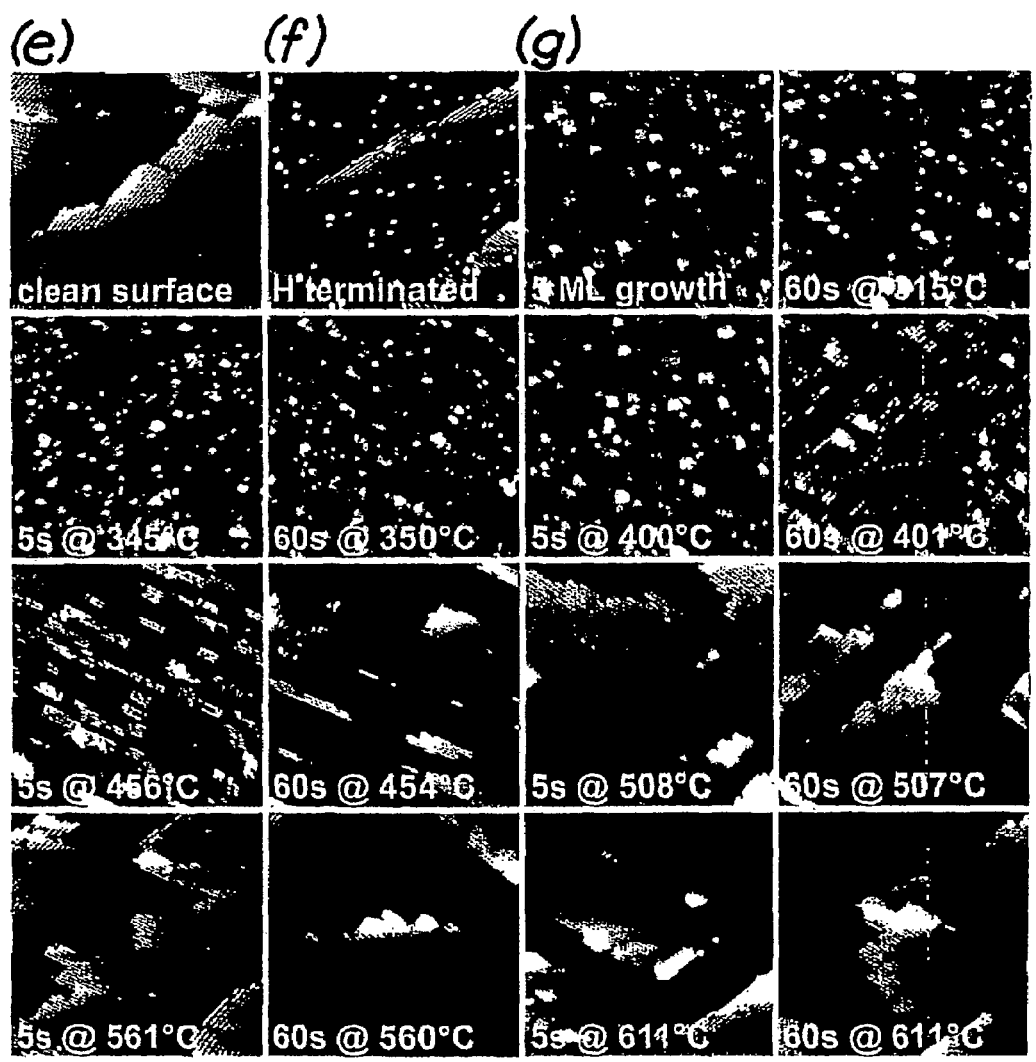

FIG. 17 shows the results of a similar study, but where the silicon surface has been passivated by hydrogen prior to silicon growth.

FIG. 17(a) is a schematic and FIG. 17(e) the corresponding filled state STM image of a clean Si(100) surface.

FIG. 17(f) is a filled state STM image of a hydrogen terminated Si(100) surface. The monohydride terminated surface shows a low density of Si dangling bonds which appear as bright protrusions in the STM image.

FIG. 17(b) is a schematic and FIG. 17(g) the corresponding filled state STM image of the sample surface after Si growth of 5 ML at 250° C. on the hydrogen terminated surface. As diffusion of Si atoms on the hydrogen terminated surface is largely suppressed by the presence of hydrogen, silicon grows in island growth mode as opposed to layer-by-layer growth on a clean Si(100) surface at 250° C.

FIGS. 17(c) and (d) are schematic and the remainder of FIG. 17 are filled state STM images of the surface after various annealing steps. The 'island' structure remains even after annealing at 315, 345, 350, and 400° C.

Further annealing at 401° C. for 55 s, however, changes the surface morphology. The islands flatten and have an elongated dimer row structure. The dimer rows exhibit dark areas similar to single missing dimer defects. These dark features appear to be monohydrides which are still adsorbed on the Si surface. After the next annealing step at 456° C. for 5 s, the surface displays a lower density of the dark features indicating that hydrogen desorption occurs during annealing. The reduced density of hydrogen at the surface allows for a higher Si diffusivity and, thus, for a change of the surface morphology. After annealing for 5 s at 508° C. Si atoms have rearranged to form terraces. However, small Si islands and holes as well as antiphase domain boundaries and a high density of missing dimer defects are present on the terraces. After further annealing at 507, 561, and 560° C. the Si terraces show a high density of missing dimer defects which are aligned to energetically favorable defect rows perpendicular to the dimer rows. The defect density is significantly higher than on the initial clean surface prior to growth and also higher than after growth on a clean Si surface and annealing. In order to rearrange Si atoms to form a terrace structure after growth, an annealing step of 561° C. for 5 s is necessary. This is about 100° C. higher than for growth on a clean Si surface, where the terrace structure is already formed at a temperature of 456° C. (see FIG. 16). The size of the STM images is 50×50 nm.

Figure 18A:
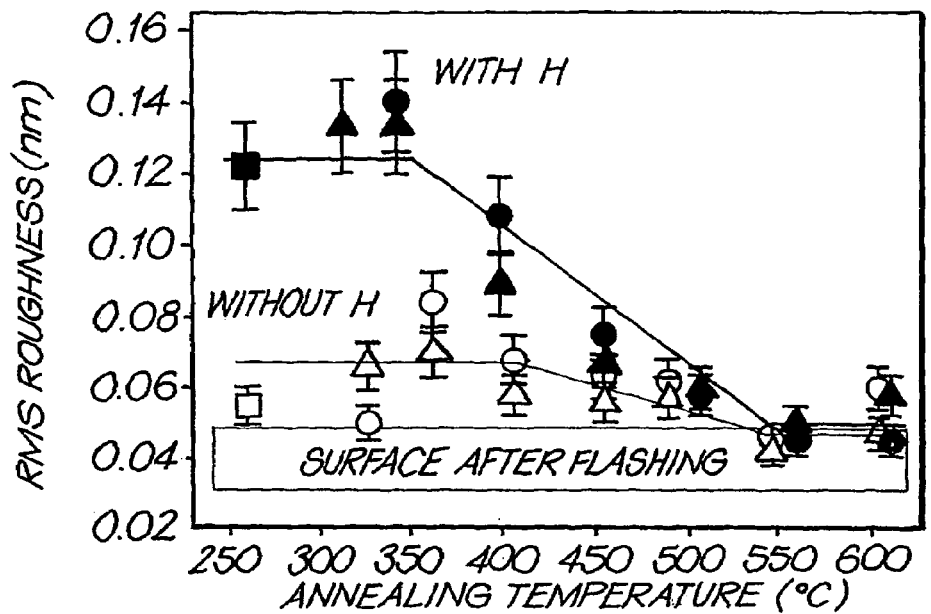
FIG. 18(a) is a graph showing the silicon surface roughness after annealing at different temperatures for growth on a clean and on a hydrogen terminated surface.

FIG. 18(a) shows the RMS (root mean square) Si surface roughness of STM images displayed in FIG. 16 (without H) and FIG. 17 (with H). For annealing temperatures below about 500° C., growth on the H terminated surface leads to a higher surface roughness compared to growth on a clean, non-H terminated surface. Annealing of the samples at temperatures below about 400° C. does not significantly change the surface roughness. The samples show a surface roughness comparable to the roughness of a clean Si surface (after flashing) for annealing temperatures of about 550° C. and higher. The lines are guide to the eye.

Figure 18B:
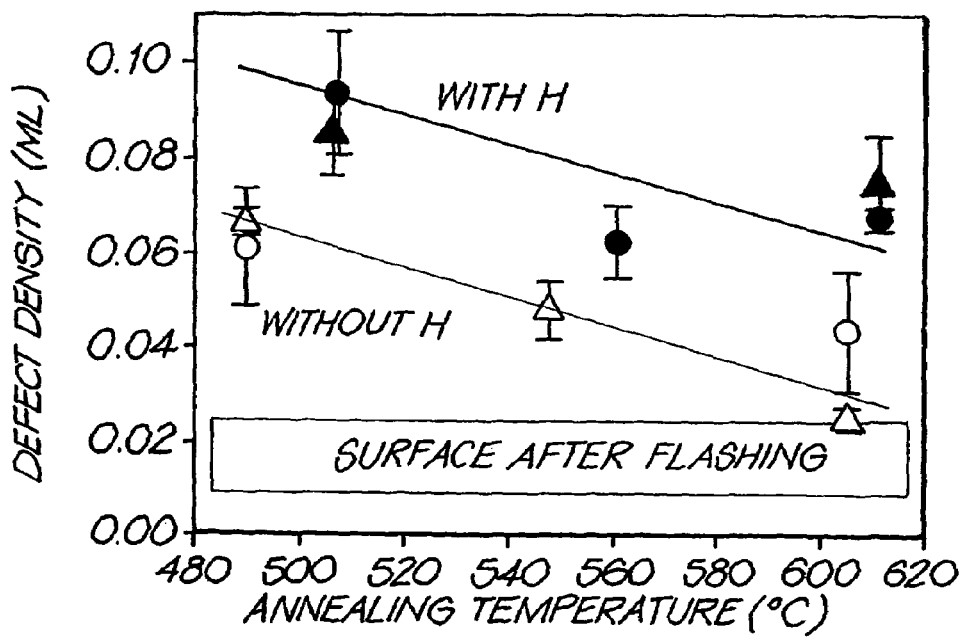
FIG. 18(b) is a graph showing the defect density after annealing at different temperatures for growth on a clean and on a hydrogen terminated surface.
Figure 19A:
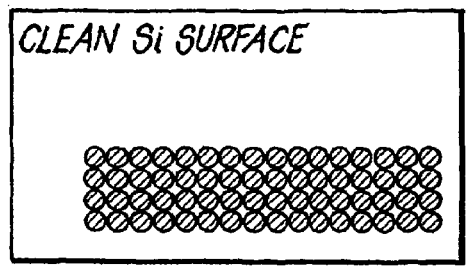
Figure 19A:
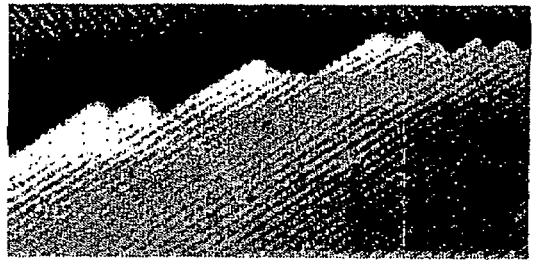
Figure 19B:
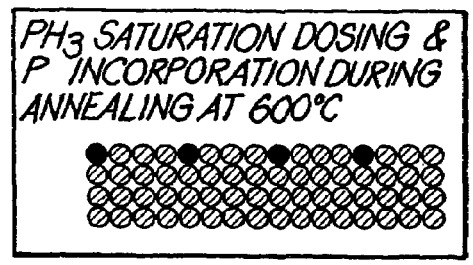
Figure 19B:
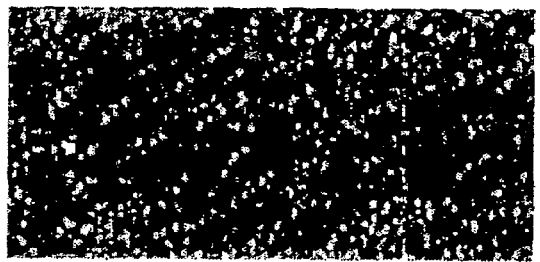
Figure 19C:
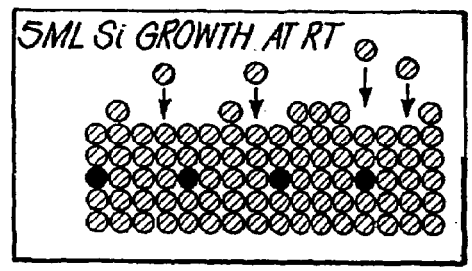
Figure 19C:
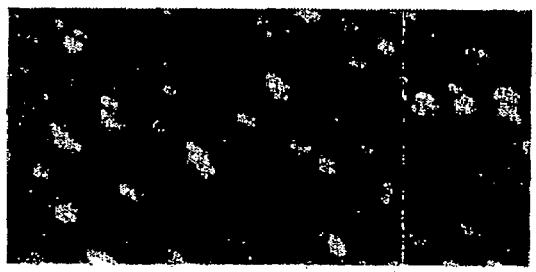
Figure 20A:
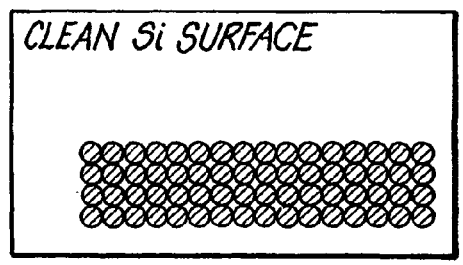
FIG. 20a to FIG. 20d are a series of diagrams and STM images showing encapsulation of a phosphine dosed silicon surface at 260° C. and subsequent annealing.
Figure 20A:
Figure 20B:
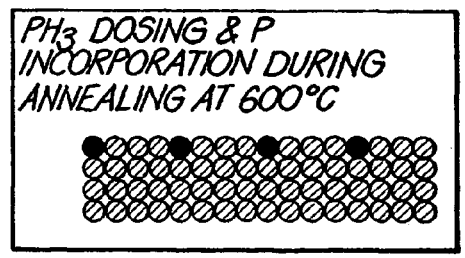
Figure 20B:
Figure 20C:
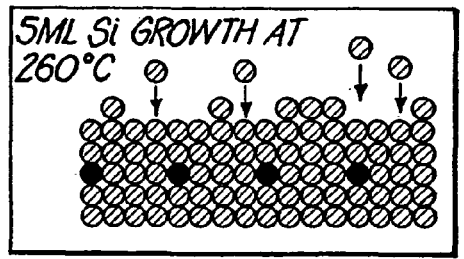
Figure 20C:
Figure 20D:
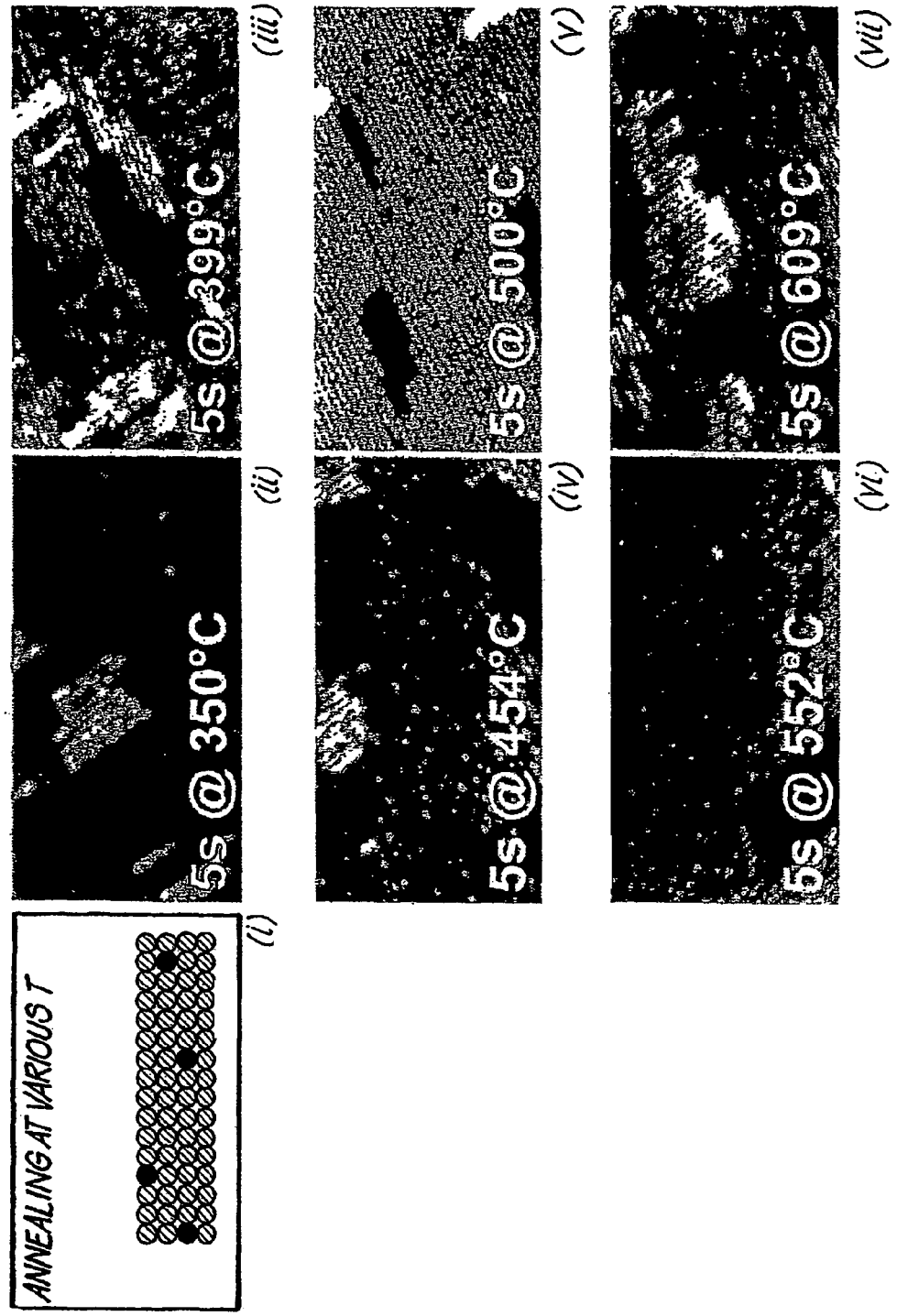

FIG. 18(b) shows the density of missing dimer defects determined from STM images from growth on a clean and hydrogen terminated Si(100) surface, respectively. For equal thermal budget, i.e. growth at 250° C. and subsequent annealing steps, the Si surface shows a significantly higher defect density after growth at 250° C. on a hydrogen terminated surface than after growth on a clean Si(100)

surface. The main reason for the higher defect density appears to be the island growth mode as opposed to the layer-by-layer growth on the clean Si(100) surface at 250° C. The coarsening process of an initially high density of islands leads to the formation of antiphase domain boundaries and vacancy areas in the terraces. Both samples, however, display higher defect densities even after annealing at more than 600° C. for one minute than a clean Si surface after flashing. The lines are guide to the eye.

These results demonstrate that to obtain smooth layers it is best to remove the hydrogen first. This gives better atomic flatness and a reduced number of defects.

Growing Silicon Over Doped Surfaces FIGS. 2 (f) and (h) (RT Growth and Rapid Annealing)

Figure 21:
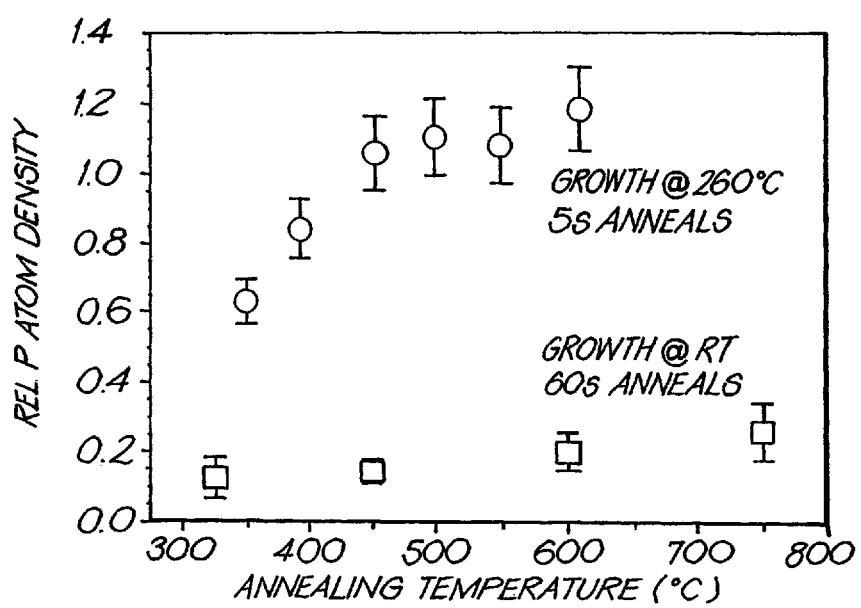
FIG. 21 is a graph showing the relative surface phosphorous atom density after annealing of phosphine dosed surfaces which were overgrown with 5 ML of Si at room temperature and at 260° C., respectively.
Figure 22A:
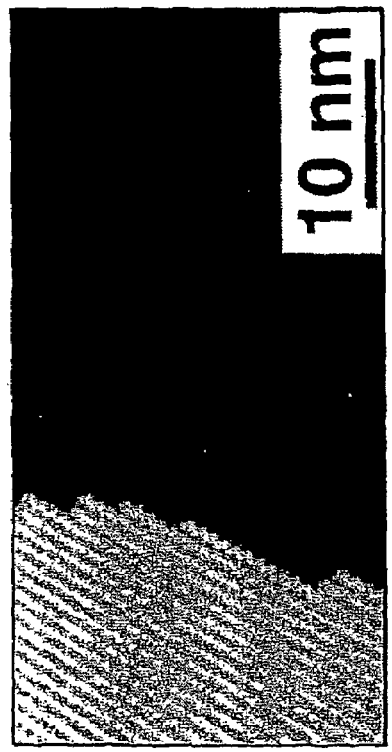
FIGS. 22(a) to (d) are a series of diagrams and STM images showing the process of saturating a silicon surface with phosphine, then annealing and encapsulating it by Si growth to fabricate a phosphorus δ-doped layer in silicon.
Figure 22A:
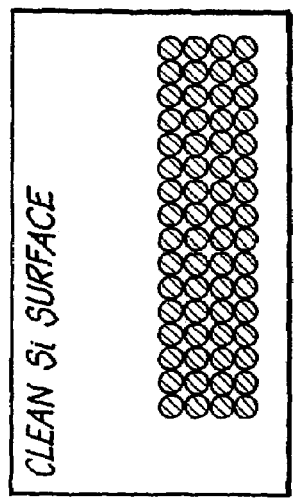
Figure 22B:
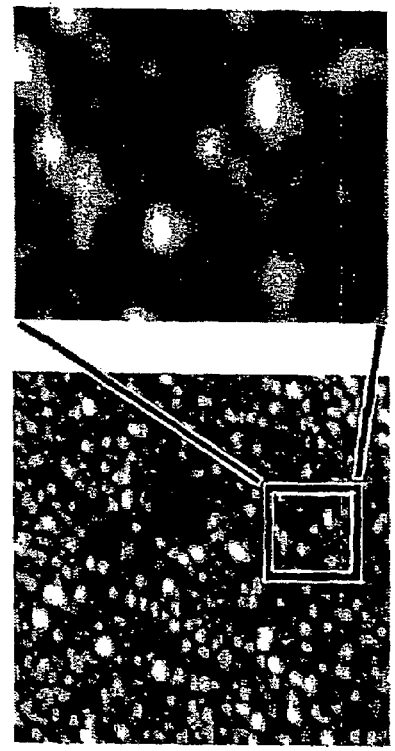
Figure 22B:
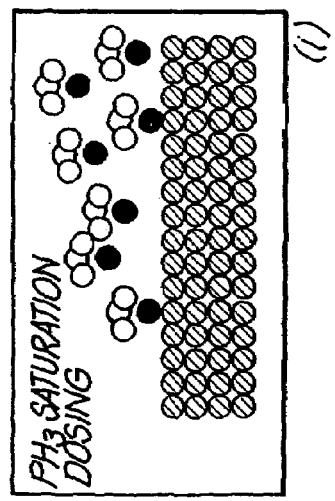
Figure 22C:
Figure 22C:
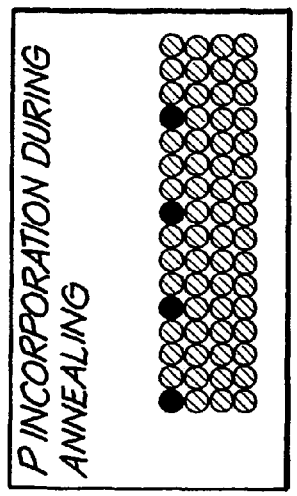
Figure 22D:
Figure 22D:
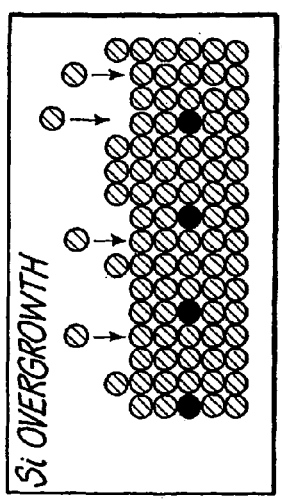

FIGS. 19 to 21 show the effects of different growth temperatures during silicon encapsulation and subsequent annealing steps, on the segregation and diffusion of P atoms to the surface.

FIG. 19 shows room temperature encapsulation of a phosphorus doped surface and subsequent annealing.

FIG. 19(ai) is a schematic and FIG. 19(aii) is a filled state STM image of a clean Si(100) 2×1 reconstructed surface.

FIG. 19(bi) is a schematic and FIG. 19(bii) is a filled state STM image of the surface after phosphine saturation dosing for 15 min at a chamber pressure of 1×10$^9$ mbar and annealing to 600° C. to incorporate phosphorus atoms and desorb hydrogen.

FIG. 19(ci) is a schematic and FIG. 19(cii) is a filled state STM image of the surface after epitaxial growth of 5 monolayers (ML) of silicon at room temperature (RT).

FIG. 19(di) is a schematic and FIGS. 19(dii), (diii), (div) and (dv) are filled state STM images of the surface after annealing of the sample for 1 min at 325° C., 450° C., 600° C. and 750° C., respectively. The surface after epitaxial growth is covered with 3D silicon islands and flattens during subsequent annealing steps. The annealing steps at 325° C. to 600° C. show an increasing density of bright zigzag features on the surface. These features are related to Si—P heterodimers at the Si(100) surface and demonstrate an increase of the density of phosphorus atoms at the surface due to diffusion of these atoms from the highly phosphorus doped layer beneath the epitaxially grown silicon layer.

FIG. 19 (ei) is a schematic and FIG. 19(eii) is a filled state STM image of the surface after annealing of the sample for 1 min at 900° C. After this final annealing step, the initial clean silicon surface has recovered after desorption of surface phosphorus atoms.

FIG. 20 shows encapsulation of a phosphorus doped surface at is 260° C. and subsequent annealing.

FIG. 20(ai) is a schematic and FIG. 20(aii) is a filled state STM image of a clean Si(100) 2×1 reconstructed surface.

FIG. 20(bi) is a schematic and FIG. 20(bii) is a filled state STM image of the surface after dosing with phosphine at room temperature annealing at 600° C. for 60 s to incorporate the phosphorus atoms into the Si surface as Si—P heterodimers. The Si—P heterodimer appears as a bright zigzag feature along the dimer row.

FIG. 20(ci) is a schematic and FIG. 20(cii) is a filled state STM image of the surface after five ML of Si are grown at 260 PC. This occurs in the layer-by-layer growth mode.

FIG. 20(di) is a schematic and FIGS. 20(dii), (diii), (div), (dv), (dvi) and (dvii) are filled state STM images of the surface after it has been annealed at temperatures of 350, 399, 454, 500, 552, and 609° C., respectively. The Si surface after growth shows single dimer rows and elongated dimer row islands as well as a low density of bright zigzag features in the dimer rows. These zigzag features are identified as Si—P heterodimers. The density of the bright zigzag features increases with increasing annealing temperature. Annealing also changes the surface morphology similar to growth on a clean Si(100) surface and annealing (FIG. 16). After annealing for 5 s at 454° C. the terrace structure reappears, however, even after annealing at 500° C. small islands are still present on the surface.

FIGS. 19 and 20 show, for the first time the use of STM imaging to measure dopant segregation and diffusion directly.

FIG. 21 is a graph showing the density of phosphorus atoms in the Si surface after Si epitaxial overgrowth at room temperature (RT) and 260° C., respectively, and annealing relative to the initial phosphorus density after phosphine dosing and P incorporation. The density of P atoms after growth at 260° C. and annealing was analyzed from the STM images presented in FIG. 20. For every annealing step, the P atom density in the surface is significantly higher for growth at 260° C. compared to RT growth due to P segregation during growth. From this it can be concluded that growth of silicon at room temperature and subsequent annealing results in less segregation and diffusion of the P atoms to the surface compared to elevated temperature growth and annealing.

Auger electron spectroscopy measurements of the density of phosphorus atoms performed after silicon growth and every annealing step are consistent with the analysis of the STM images.

Phosphorus Delta Doping

In order to determine the electrical activation of the phosphorus atoms epitaxially overgrown by silicon, a phosphorus delta doped layer was grown and made into a van der Pauw device structure; see FIG. 23 (a). The fabrication steps for such a device are outlined in FIG. 22.

FIG. 22(ai) is a schematic and FIG. 22(aii) is an STM image which shows a clean (100)2×1 silicon surface.

FIG. 22(bi) is a schematic and FIG. 22(bii) is an STM image and enlargement which shows the surface after phosphine saturation dosing at room temperature.

FIG. 22(ci) is a schematic and FIG. 22(cii) is an STM image which shows the surface after annealing at 550° C. to incorporate the phosphorus atoms into the surface as P—Si dimers.

FIG. 22(di) is a schematic and FIG. 22(dii) is an STM image which shows the surface after growing 24 nm of epitaxial silicon at 250° C.

Figure 23A:
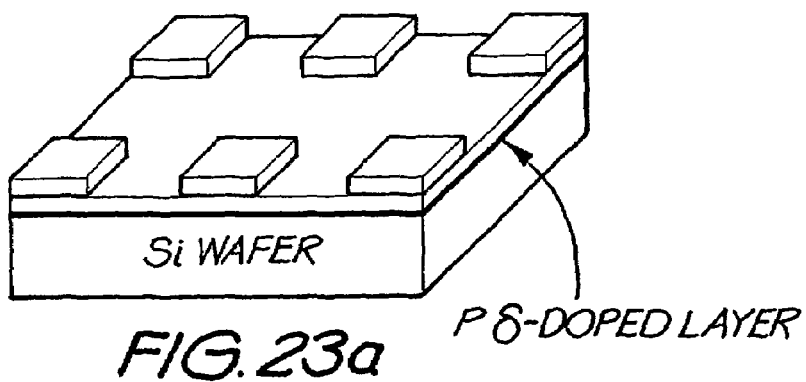
FIG. 23(a) is a schematic diagram of a phosphorus δ-doped silicon sample with ohmic contacts for Hall effect measurements; (b) and (c) show the results of the Hall effect measurements.
Figure 23B:
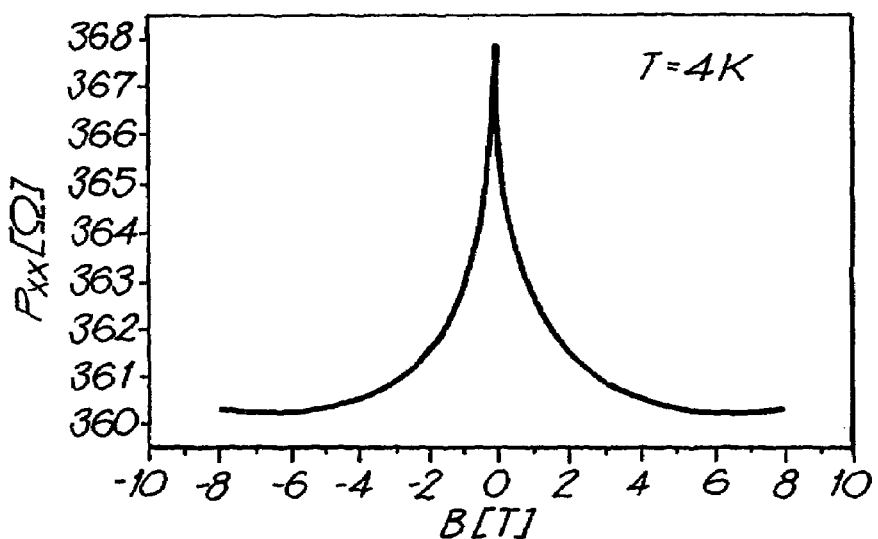

FIG. 23(a) is the resulting device after formation of ohmic contacts in Van der Pauw structure. FIG. 23(b) shows the sheet resistivity, $\rho_{xx}$ as a function of magnetic field, B at a sample temperature of 4 K The resulting data shows a peak at B=0, characteristic of weak localisation of electrons. Removing the weak localisation correction, and calculating the Hall slope (from FIG. 23(c)) allows us to estimate the mobility of the 2D layer as 130.3 cm$^2$V$^{-1}$s$^{-1}$.

Figure 23C:
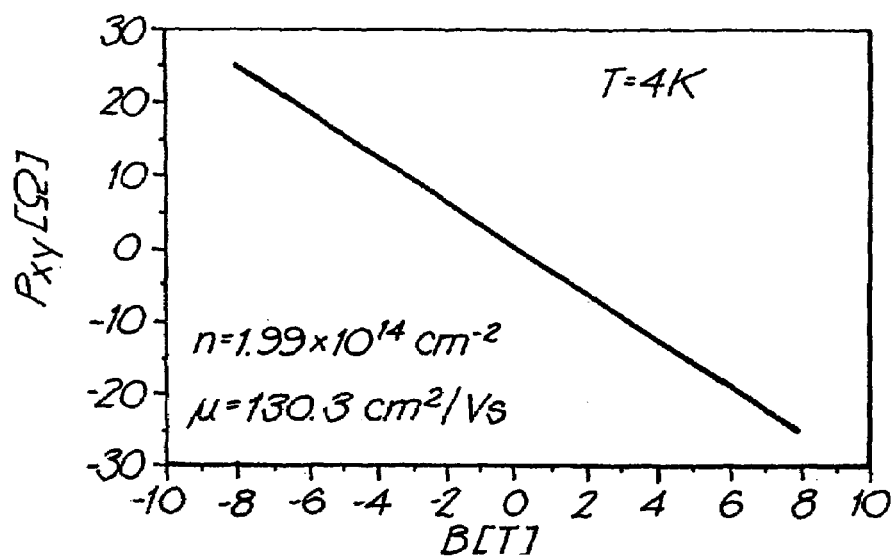

FIG. 23(c) shows the Hall resistivity for this phosphorus delta doped layer giving a carrier density of 2.0×10$^{14}$ cm$^{-2}$. This density is in excellent agreement with the 2D dopant density demonstrating that all of the phosphorus dopants that are incorporated into the silicon crystal are electrically active within the measurement error. This is a significant result for the fabrication of electronic device structures since it demonstrates that the phosphorus atoms incorporated using this process will be electrically active at these high doping densities.

Figure 24:
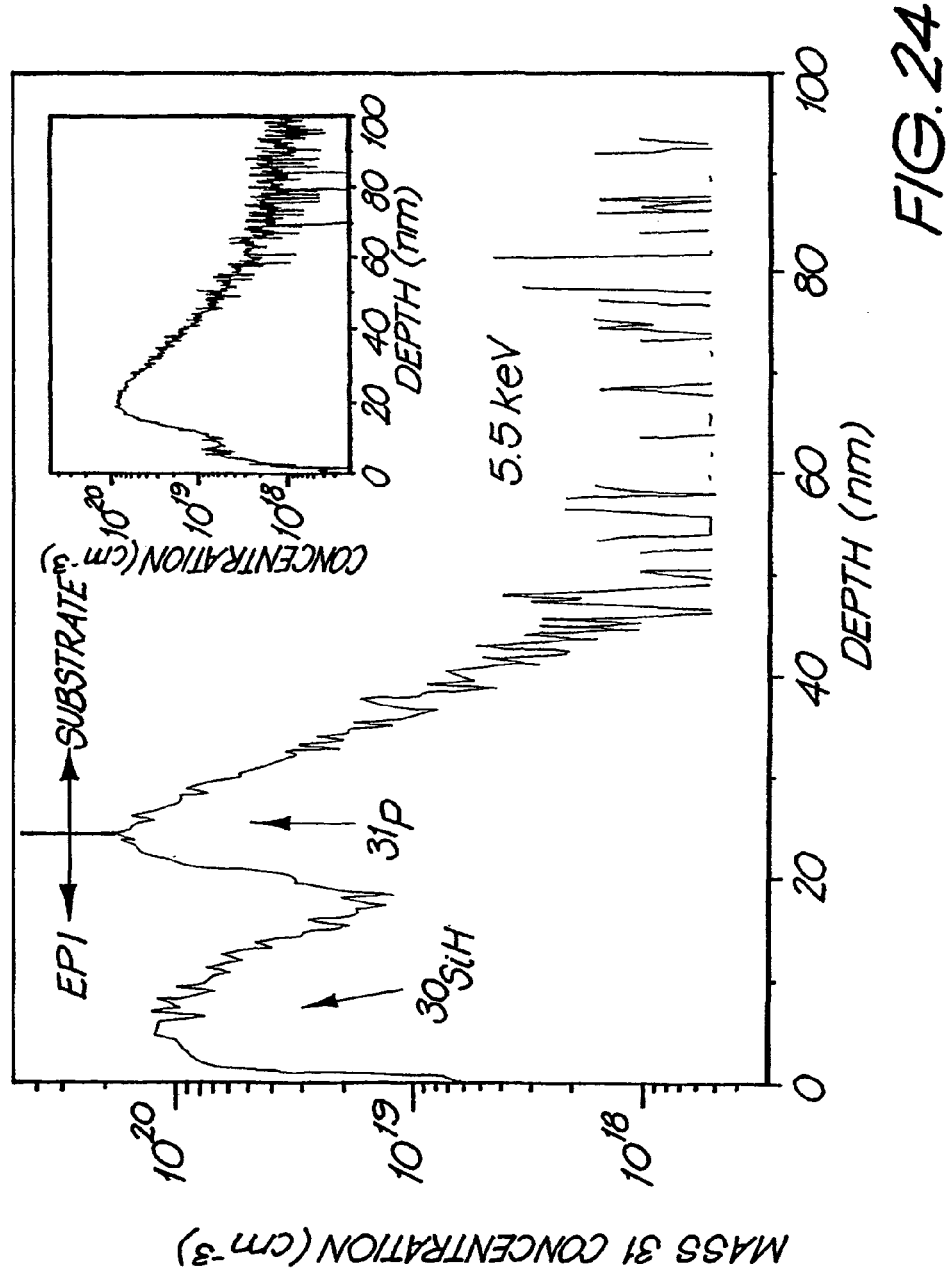
FIG. 24 is a graph showing the mass-31 depth profile of a phosphorus δ-doped layer in silicon measured using secondary ion mass spectrometry.

In order to determine the extent of the confinement of the P atoms within the delta doped layer we have performed secondary ion mass spectrometry (SIMS) measurements on our delta doped sample. FIG. 24 shows a mass 31 depth profile of a phosphorus δ-doped layer in silicon determined by SIMS, using 5.5 keV Cs$^+$ primary ions in an ATOMIKA system. The mass 31 signal is related to both $^{30}$SiH and $^{31}$P as the mass discrimination of the ATOMIKA system is not sufficient to separate the small mass difference between $^{30}$SiH and $^{31}$P. However, by comparing this measurement to a high mass resolution SIMS measurement using a CAMECA system (insert in FIG. 24) we can clearly identify the peak near the surface as a $^{30}$SiH peak due to adsorbed hydrogen at the surface and the peak at a depth of ~24 nm as the phosphorus peak. This phosphorus peak is located at the interface between silicon epitaxial layer and silicon substrate demonstrating a thickness of the epitaxial layer of ~24 nm. The slow decrease of the phosphorus signal towards the substrate is due to a measurement artefact, the so-called ion beam mixing. It means that phosphorus atoms in the silicon matrix which are hit by the Cs$^+$ primary ions are pushed further into the silicon wafer, thus broadening the phosphorus peak. The full width at half maximum (FWHM) of the phosphorus peak increases with primary ion energy due to the ion beam mixing. We find a minimum FWHM of ~5 nm for a primary ion energy of 2 keV (not shown here). Taking the ion beam mixing into account the width of the phosphorus δ-doped layer is <5 nm.

Finally, it is important to note that the fabrication strategy demonstrated here is also directly applicable to other silicon based quantum computer architectures.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method of fabricating a nanoscale or atomic scale product, comprising the following steps:
    (a) preparing a clean silicon crystal surface;
    (b) passivating the surface with atomic hydrogen;
    (c) selectively desorbing single hydrogen atoms from the passivated surface using a STM tip to form a pattern of exposed areas in the hydrogen layer, where the areas are spaced from each other by 100 nm or less;
    (d) exposing the patterned surface to donor molecules to produce an array of single donor atom bearing molecules in the exposed areas;
    (e) annealing the arrayed surface at between about 300° C. to about 650° C. to incorporate electrically active donor atoms into the silicon.

2. A method according to claim 1, where the temperature range is between 300° C. to 530° C.

3. A method according to claim 2, where the temperature range is between 350° C., to 530° C.

4. A method according to claim 2, where the hydrogen is desorbed using an electron beam.

5. A method according to claim 4, where the electron beam is generated from an STM or a scanning electron microscope (SEM).

6. A method according to claim 2, where the hydrogen is desorbed using ultra-violet (UV) light.

7. A method according to claim 1, including the further step of using an STM to view donor atoms on the silicon surface to confirm that the donor atoms are in a substitutional lattice site in the silicon, and are therefore electrically active.

8. A method according to claim 1, where the silicon surface is the (100)-oriented surface having a 2×1 unit cell surface structure with rows of s-bonded silicon dimers, and the donor atoms replace silicon atoms in the surface to form donor-silicon heterodimers.

9. A method according to claim 1, where the donor is phosphorus.

10. A method according to claim 1, where the donor atoms are placed 50 nm or less apart.

11. A method according to claim 1, where the donor atoms are placed 20 nm or less apart.

12. A method of fabricating a nanoscale or atomic scale product comprising the following steps:
    (a) preparing a clean silicon crystal surface;
    (b) passivating the surface with atomic hydrogen;
    (c) inserting donor atoms into the silicon at lithographically defined areas where the hydrogen layer was desorbed using an STM tip;
    (d) desorbing the passivating hydrogen atoms from the doped surface by either flashing the surface to between about 500° C. to about 650° C., or using an electron beam, or ultra-violet (UV) light;
    (e) growing silicon over the surface, at between about 0° C. to about 400° C. to prevent diffusion of the donor atoms and to encapsulate electrically active donor atoms in the surface;
    (f) thermally annealing the surface so that it becomes atomically smooth.

13. A method according to claim 12, where the growth of silicon in step (e) takes place between 0° C. and 250° C.

14. A method according to claim 13, where the growth of silicon in step (e) takes place at room temperatures.

15. A method according to claim 12, where the silicon surface is the (100)-oriented surface having a 2×1 unit cell surface structure with rows of s-bonded silicon dimers, and the donor atoms replace silicon atoms in the surface to form donor-silicon heterodimers.

16. A method according to claim 12, where the donor is phosphorus and the phosphorous atoms are placed 100 nm or less apart.

17. A method according to claim 12, where the donor atoms are placed 50 nm or less apart.

18. A method according to claim 12, where the donor atoms are placed 20 nm or less apart.

19. A method of fabricating a nanoscale or atomic scale product comprising the following steps:
    (a) preparing a clean silicon crystal surface;
    (b) exposing the surface to donor molecules such that donor atoms adsorb over the silicon surface;
    (c) annealing the arrayed surface at between about 300° C. to about 650° C. to incorporate electrically active donor atoms into the silicon;
    (d) using an STM to view donor atoms on the surface to confirm that the donor atoms are in a substitutional lattice site in the silicon, and are therefore electrically active.

20. A method according to claim 19, where the temperature range is between 300° C. to 530° C.

21. A method according to claim 20, where the temperature range is between 350° C., to 530° C.

22. A method according to claim 20, where the hydrogen is desorbed using an electron beam.

23. A method according to claim 22, where the low energy electron beam is generated from an STM or SEM.

24. A method according to claim 20, where the hydrogen is desorbed using ultra-violet (UV) light.

25. A method according to claim 19, where the temperature range is 530° C. to 650° C. to both incorporate the donor atoms and desorb the hydrogen in a single step.

26. A method according to claim 19, including the further step of growing silicon over the surface, at between about 0° C. to 400° C.

27. A method according to claim 26, where the temperature is between 0° C. to 250° C.

28. A method according to claim 27, where the temperature is at room temperatures.

29. A method according to claim 19, including the further step of thermally annealing the surface so that it becomes atomically smooth.

30. A method according to claim 19, where the silicon surface is the (100)-oriented surface having a 2×1 unit cell surface structure with rows of s-bonded silicon dimers, and the donor atoms replace silicon atoms in the surface to form donor-silicon heterodimers.

31. A method according to claim 19, where the donor is phosphorus and the phosphorous atoms are placed 100 nm or less apart.

32. A method according to claim 19, where the donor atoms are placed 50 nm or less apart.

33. A method according to claim 19, where the donor atoms are placed 20 nm or less apart.

34. A method of fabricating a nanoscale or atomic scale product as defined above, comprising the following steps:
(a) preparing a clean silicon crystal surface;
(b) exposing the surface to donor molecules such that the donor molecules adsorb over the silicon surface to form a doped layer;
(c) annealing the surface at between about 300° C. and about 650° C. to incorporate the donor atoms into the silicon surface;
(d) growing silicon over the surface, at between about 0° C. to about 400° C. to prevent diffusion of the donor atoms, and to encapsulate electrically active donor atoms in the surface;
(e) measuring the electrical activity of the doped layer.

35. A method according to claim 34, where the annealing step uses a temperature range between 300° C. to 530° C.

36. A method according to claim 35, where the temperature range is between 350° C., to 530° C.

37. A method according to claim 35, where the hydrogen is desorbed using an electron beam.

38. A method according to claim 37, where the electron beam is generated from an STM or SEM.

39. A method according to claim 35, where the hydrogen is desorbed using ultra-violet (UV) light.

40. A method according to claim 34, where the temperature range is between 530° C. to 650° C. to both incorporate the donor atoms and desorb the hydrogen in a single step.

41. A method according to claim 34, where the temperature used in the growing step is between 0° C. to 250° C.

42. A method according to claim 41, where the temperature is room temperatures.

43. A method according to claim 34, where the silicon is (100) or (001) having a 2×1 unit cell surface structure with rows of σ-bonded silicon dimers, and the donor atoms replace silicon atoms in the surface to form donor-silicon heterodimers.

44. A method according to claim 34, where the donor is Phosphorus.

45. A method according to claim 34, where the donor atoms are placed 50 nm or less apart.

46. A method according to claim 34, where the donor atoms are placed 20 nm or less apart.

47. A quantum computer comprising a product fabricated according to any one of claims 1 to 46.

48. A nanoscale product made according to the method of claim 1, being an intermediate product of a process for fabricating an atomic scale device such as a quantum computer, the nanoscale product comprising:
a silicon crystal where donor atoms are substituted for silicon atoms in the crystal surface to form an array of donor atoms spaced apart from each other by 100 nm or less, and where the donor atoms are electrically active.

49. A nanoscale product according to claim 48, where the silicon surface is the (100)-oriented surface having a 2×1 unit cell surface structure with rows of s-bonded silicon dimers, and the donor atoms replace silicon atoms in the surface to form donor-silicon heterodimers.

50. A nanoscale product according to claim 48, where the donor is phosphorus.

51. A nanoscale product according to claim 48, where the donor atoms are spaced apart from each other by 50 nm or less.

52. A nanoscale product according to claim 48, where the donor atoms are spaced apart from each other by 20 nm or less.

53. A nanoscale product made according to the method of claim 1, the nanoscale product comprising:
a silicon crystal encapsulating a layer of donor atoms substituted for silicon atoms in the crystal, where substantially all the donor atoms are electrically active.

54. A nanoscale product according to claim 53, where the encapsulating layers are expitaxially grown over the layer of donor atoms.

55. A nanoscale product according to claim 53, where the encapsulating layers are between 5 and 50 nm deep.

56. A nanoscale product according to claim 53, where the silicon surface is the (100)-oriented surface, and case the donor atoms replace silicon atoms to form donor-silicon heterodimers.

57. A nanoscale product according to claim 53, where the donor is phosphorus.

58. A nanoscale product according to claim 53, where the donor atoms are placed in an array.

* * * * *